(12) United States Patent
Nishimura et al.

(10) Patent No.: US 10,717,818 B2
(45) Date of Patent: Jul. 21, 2020

(54) POLYMER CONTAINING TRIAZINE RING AND COMPOSITION CONTAINING SAME

(71) Applicant: NISSAN CHEMICAL INDUSTRIES, LTD., Tokyo (JP)

(72) Inventors: Naoya Nishimura, Funabashi (JP); Takahiro Kaseyama, Funabashi (JP); Kei Yasui, Funabashi (JP); Daisuke Maeda, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 142 days.

(21) Appl. No.: 15/503,330

(22) PCT Filed: Aug. 12, 2015

(86) PCT No.: PCT/JP2015/072844
§ 371 (c)(1),
(2) Date: Feb. 10, 2017

(87) PCT Pub. No.: WO2016/024613
PCT Pub. Date: Feb. 18, 2016

(65) Prior Publication Data
US 2018/0215870 A1  Aug. 2, 2018

(30) Foreign Application Priority Data

Aug. 13, 2014 (JP) .................................. 2014-164844
Dec. 26, 2014 (JP) .................................. 2014-264118

(51) Int. Cl.
*C08G 73/06* (2006.01)
*G03F 7/38* (2006.01)
(Continued)

(52) U.S. Cl.
CPC ......... *C08G 73/0644* (2013.01); *C08G 73/06* (2013.01); *G03F 7/0007* (2013.01);
(Continued)

(58) Field of Classification Search
CPC ........ G03F 7/0382; G03F 7/038; G03F 7/022; G03F 7/30; G03F 7/0392; C08L 79/06; C08G 73/0644
(Continued)

(56) References Cited

U.S. PATENT DOCUMENTS 10,228,620 B2 * 3/2019 Nishimura ............. C08K 5/101
2012/0049308 A1 * 3/2012 Nishimura ......... C08G 73/0273
257/432

(Continued)

FOREIGN PATENT DOCUMENTS

JP 60-101539 A 6/1985
JP 2004-156001 A 6/2004
(Continued)

OTHER PUBLICATIONS

International Search Report issued in PCT/JP2015/072844 (PCT/ISA/210), dated Nov. 2, 2015.
(Continued)

*Primary Examiner* — John S Chu
(74) *Attorney, Agent, or Firm* — Birch, Stewart, Kolasch & Birch, LLP

(57) ABSTRACT

It is possible to obtain a thin film that can form a minute pattern and that has a high index of refraction by using a polymer containing a triazine ring and containing a repeating unit structure represented for example by formula (22) or (26).

(22)

(26)

(Continued)

-continued

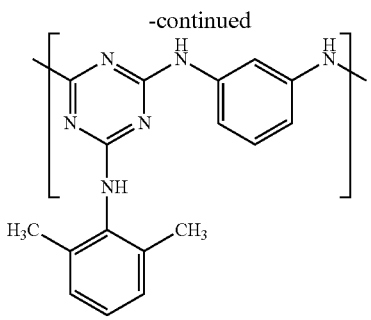

20 Claims, 3 Drawing Sheets

(51) Int. Cl.
G03F 7/022 (2006.01)
G03F 7/038 (2006.01)
G03F 7/30 (2006.01)
G03F 7/00 (2006.01)
G03F 7/039 (2006.01)
G03F 7/16 (2006.01)
G03F 7/20 (2006.01)
G03F 7/32 (2006.01)

(52) U.S. Cl.
CPC .............. *G03F 7/022* (2013.01); *G03F 7/038* (2013.01); *G03F 7/039* (2013.01); *G03F 7/0392* (2013.01); *G03F 7/162* (2013.01); *G03F 7/168* (2013.01); *G03F 7/2002* (2013.01); *G03F 7/30* (2013.01); *G03F 7/322* (2013.01)

(58) Field of Classification Search
USPC ................ 524/606, 612; 430/270.1; 528/423
See application file for complete search history.

(56) References Cited

U.S. PATENT DOCUMENTS

| | | | | |
|---|---|---|---|---|
| 2013/0289203 A1* | 10/2013 | Nishimura | ......... | C08G 73/0644 |
| | | | | 524/606 |
| 2014/0371367 A1* | 12/2014 | Nishimura | .............. | C08L 79/04 |
| | | | | 524/413 |
| 2017/0362382 A1* | 12/2017 | Nishimura | ............. | C08K 5/101 |

FOREIGN PATENT DOCUMENTS

| | | |
|---|---|---|
| JP | 2012-92261 A | 5/2012 |
| WO | WO 2010/128661 A1 | 11/2010 |

OTHER PUBLICATIONS

Written Opinion of the International Searching Authority issued in PCT/JP2015/072844 (PCT/ISA/237), dated Nov. 2, 2015.
Chinese Office Action for Chinese Application No. 201580051265.7, dated Nov. 2, 2018.
Karatas et al., "The Synthesis and Characterization of s-Triazine-Cored and [Fe(III)Salen]-Capped Polymer Complexes," J. Inorg. Organomet. Polym., vol. 21, 2011 (published Jun. 24, 2011), pp. 688-693.

* cited by examiner

POLYMER CONTAINING TRIAZINE RING AND COMPOSITION CONTAINING SAME

TECHNICAL FIELD

This invention relates to a triazine ring-containing polymer and a composition that includes the same.

BACKGROUND ART

In recent years, a need has arisen for high-performance polymeric materials in the development of electronic devices such as liquid-crystal displays, organic electroluminescent (EL) displays, touch panels, optical semiconductor (LED) devices, solid-state image sensors, organic thin-film solar cells, dye-sensitized solar cells and organic thin-film transistors (TFT).

The specific properties desired of such materials include: (1) heat resistance, (2) transparency, (3) high refractive index, (4) high solubility, (5) low volume shrinkage, (6) high moisture resistance at high temperatures, and (7) high film hardness.

The inventors earlier discovered that polymers containing recurring units which have a triazine ring and an aromatic ring possess a high refractive index and are able, with the polymer alone, to achieve a high heat resistance, high transparency, high refractive index, high solubility and low volume shrinkage, thus making such polymers suitable as film-forming compositions in the fabrication of electronic devices (Patent Document 1).

Of related interest, pattern formation using transparent materials is carried out in spacers, insulating films, protective films and the like in liquid-crystal display elements, and many negative-working photosensitive compositions have hitherto been described for such applications.

In particular, recently, with the increased demand for high-definition liquid-crystal displays and cell phone displays, there has arisen a desire for small patterns not more than 10 μm in diameter.

Also, in touch panels, to enhance the visibility of the transparent electrode, there is an increased need for a high refractive index layer. However, the presence of an insulating film in electrode wiring areas affects responsiveness, and so it is necessary to remove the insulating layer over a width of 100 to 1,000 μm from the wiring areas.

Existing materials used in this application are inadequate in terms of refractive index. Moreover, it is difficult to increase the refractive index above 1.7 while maintaining the transparency.

Although the polymer of Patent Document 1 is able to address such needs in terms of the refractive index, there remains room for improvement with regard to fine pattern formability.

Patent Document 2 discloses a pattern-forming composition that includes a triazine ring-containing polymer, but this polymer has a refractive index of less than 1.7 and is thus unsuitable for the above applications requiring a higher index of refraction.

PRIOR ART DOCUMENTS

Patent Documents

Patent Document 1: WO 2010/128661
Patent Document 2: JP-A 2004-156001

SUMMARY OF THE INVENTION

Problems to be Solved by the Invention

It is therefore an object of the invention to provide a triazine ring-containing polymer which can form a thin film having a high refractive index and excellent transparency and which is also capable of forming a fine pattern having a high refractive index. Another object is to provide a composition containing such a polymer.

Means for Solving the Problems

The inventors have conducted extensive investigations in order to achieve these objects. As a result, they have discovered that, by using a triazine ring-containing polymer having arylamino groups on side chains and having also carboxyl groups on aryl groups making up the main chain or side chains, thin films having a high refractive index and excellent transparency can be formed and fine patterns having a high refractive index can also be formed.

Accordingly, the invention provides:

1. A triazine ring-containing polymer which is characterized by including a recurring unit structure of formula (1) below:

[Chemical Formula 1]

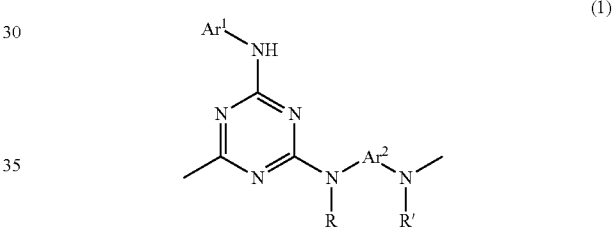

wherein R and R' each independently represent a hydrogen atom, an alkyl group, an alkoxy group, an aryl group or an aralkyl group; $Ar^1$ represents an aryl group which may be substituted with an alkyl, alkoxy, aryl, aralkyl or carboxyl group; and $Ar^2$ represents at least one moiety selected from the group consisting of moieties of formulas (2) to (13):

[Chemical Formula 2]

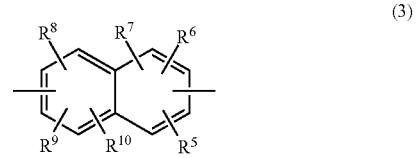

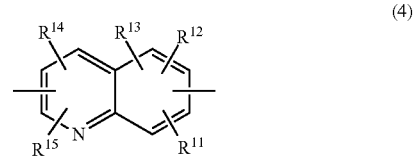

-continued (5) 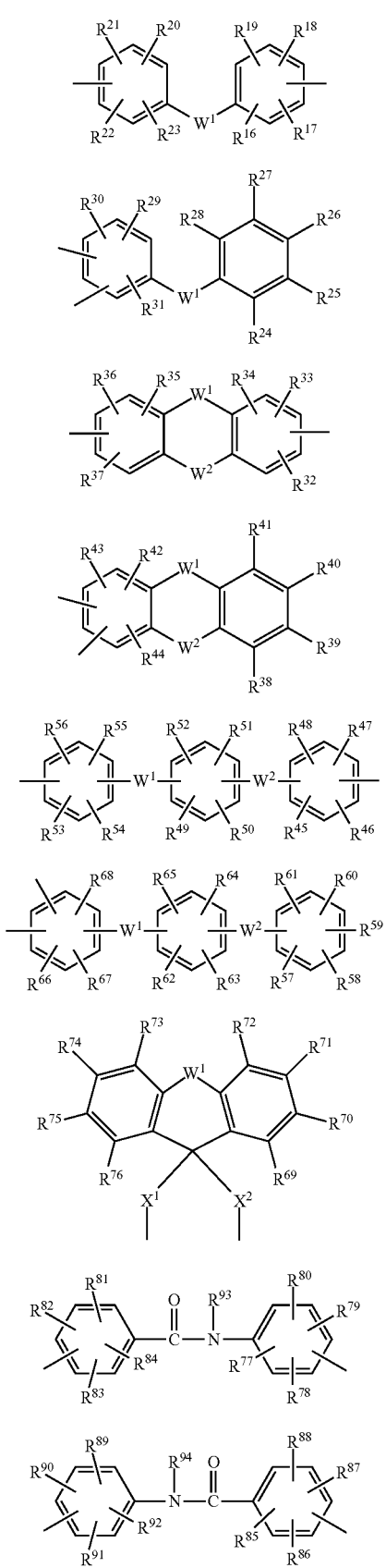

(6)

(7)

(8)

(9)

(10)

(11)

(12)

(13)

wherein $R^1$ to $R^{92}$ each independently represent a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; $R^{93}$ and $R^{94}$ each represent a hydrogen atom or an alkyl group of 1 to 10 carbon atoms which may have a branched structure; $W^1$ and $W^2$ each independently represent a single bond, $CR^{95}R^{96}$, C=O, O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure; and $X^1$ and $X^2$ each independently represent a single bond, an alkylene group of 1 to 10 carbon atoms which may have a branched structure, or a group of formula (14):

[Chemical Formula 3]

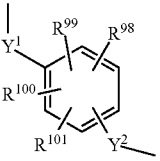

(14)

wherein $R^{98}$ to $R^{101}$ each independently representing a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; and $Y^1$ and $Y^2$ each independently representing a single bond or an alkylene group of 1 to 10 carbon atoms which may have a branched structure; with the proviso that the recurring unit structure of formula (1) has, on either or both of $Ar^1$ and $Ar^2$, at least one carboxyl group on an aromatic ring;

2. The triazine ring-containing polymer of 1 above, wherein $Ar^1$ is an aryl group substituted with a carboxyl group;

3. The triazine ring-containing polymer of 1 above, wherein the moieties of formulas (2) to (13) all have therein at least one carboxyl group on at least one aromatic ring;

4. The triazine ring-containing polymer of 3 above, wherein $Ar^1$ is an aryl group substituted with an alkyl, alkoxy, aryl or aralkyl group;

5. The triazine ring-containing polymer of any one of 1 to 4 above which further includes a recurring unit structure of formula (1') below:

[Chemical Formula 4]

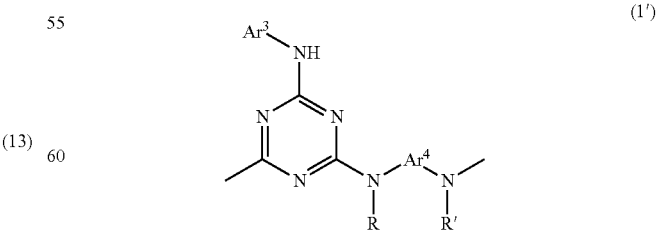

(1')

wherein R and R' each independently represent a hydrogen atom, an alkyl group, an alkoxy group, an aryl group or an aralkyl group; $Ar^3$ represents an aryl group substituted with an alkyl, alkoxy, aryl or aralkyl group; and $Ar^4$ represents at least one moiety selected from the group consisting of moieties of formulas (2') to (13'):

[Chemical Formula 5]

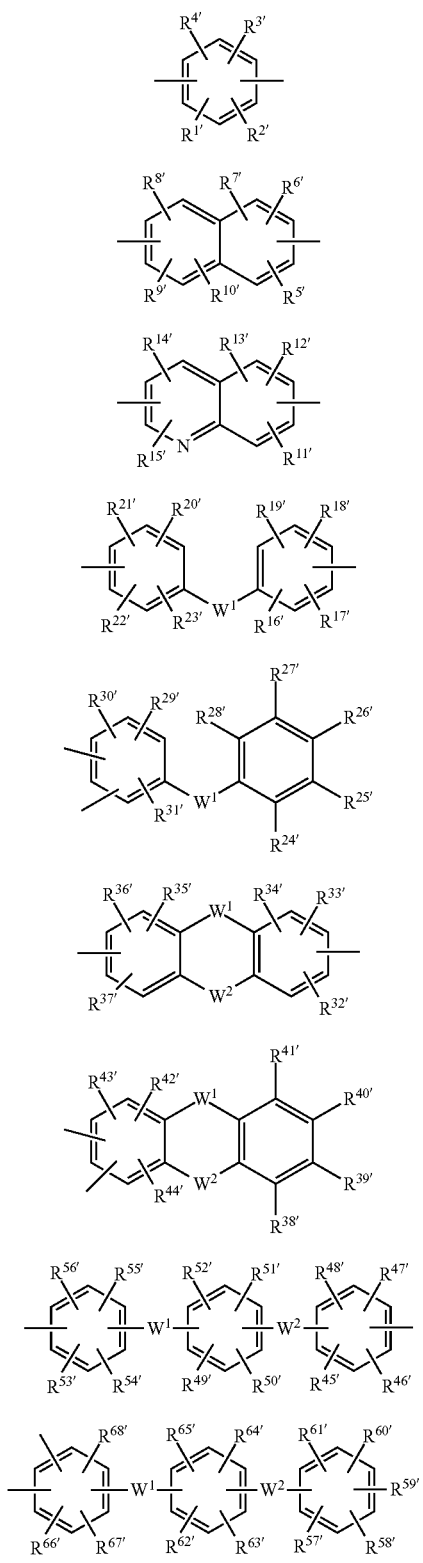

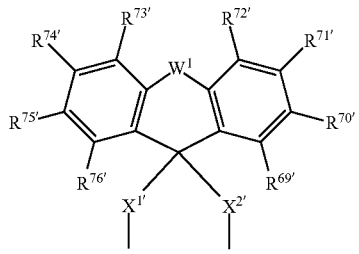

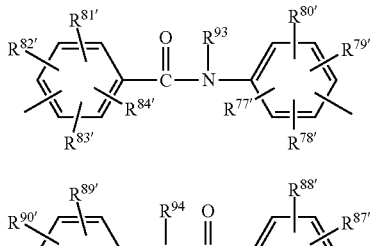

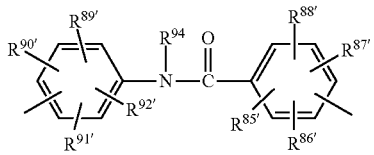

wherein $R^{1'}$ to $R^{92'}$ each independently represent a hydrogen atom, a halogen atom, a sulfo group, an alkyl group of 1 to 10 carbon atoms which may have a branched structure, or an alkoxy group of 1 to 10 carbon atoms which may have a branched structure; $R^{93}$ and $R^{94}$ each represent a hydrogen atom or an alkyl group of 1 to 10 carbon atoms which may have a branched structure; $W^1$ and $W^2$ each independently represent a single bond, $CR^{95}R^{96}$, C=O, O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure; and $X^{1'}$ and $X^{2'}$ each independently represent a single bond, an alkylene group of 1 to 10 carbon atoms which may have a branched structure, or a group of formula (14'):

[Chemical Formula 6]

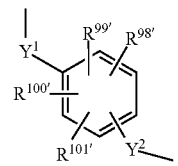

wherein $R^{98'}$ to $R^{101'}$ each independently representing a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ each independently representing a single bond or an alkylene group of 1 to 10 carbon atoms which may have a branched structure;

6. The triazine ring-containing polymer of 5 above, wherein $Ar^1$ and $Ar^4$ are aryl groups having an alkyl group of 1 to 20 carbon atoms on at least one ortho position with respect to the NH group on $Ar^1$ and $Ar^4$;

7. The triazine ring-containing polymer of 6 above, wherein $Ar^1$ and $Ar^4$ are phenyl groups having an alkyl group of 1 to 5 carbon atoms at both ortho positions;

8. The triazine ring-containing polymer of 7 above, wherein $Ar^1$ has formula (15):

[Chemical Formula 7]

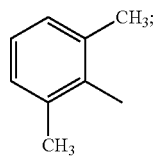
(15)

9. The triazine ring-containing polymer of any one of 1 and 3 to 8 above, wherein $Ar^2$ has formula (16):

[Chemical Formula 8]

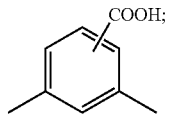
(16)

10. The triazine ring-containing polymer of 9 above, wherein $Ar^2$ has formula (17):

[Chemical Formula 9]

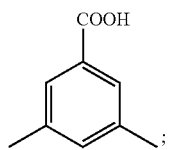
(17)

11. The triazine ring-containing polymer of 5 above, wherein $Ar^4$ has formula (18):

[Chemical Formula 10]

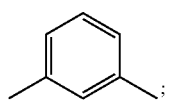
(18)

12. The triazine ring-containing polymer of 1 or 5 above which further includes a recurring unit structure of formula (1″) below:

[Chemical Formula 11]

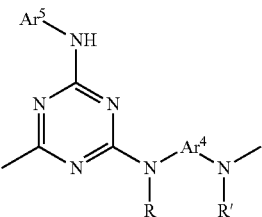
(1″)

wherein R and R' each independently represent a hydrogen atom, an alkyl group, an alkoxy group, an aryl group or an aralkyl group; $Ar^5$ represents an unsubstituted aryl group; and $Ar^4$ represents at least one moiety selected from the group consisting of moieties of formulas (2′) to (13′):

[Chemical Formula 12]

-continued

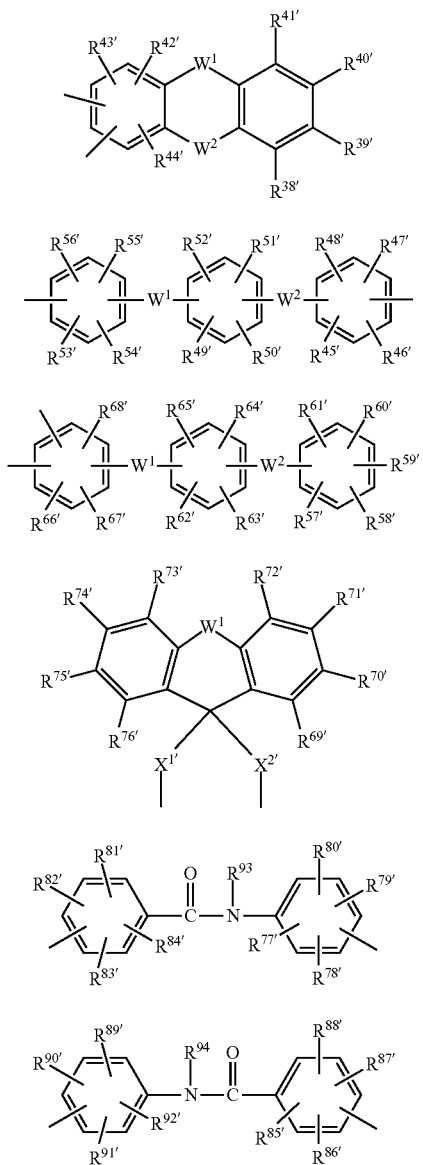

(8')
(9')
(10')
(11')
(12')
(13')

wherein $R^{1'}$ to $R^{92'}$ each independently represent a hydrogen atom, a halogen atom, a sulfo group, an alkyl group of 1 to 10 carbon atoms which may have a branched structure, or an alkoxy group of 1 to 10 carbon atoms which may have a branched structure; $R^{93}$ and $R^{94}$ each represent a hydrogen atom or an alkyl group of 1 to 10 carbon atoms which may have a branched structure; $W^1$ and $W^2$ each independently represent a single bond, $CR^{95}R^{96}$, $C=O$, O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure; and $X^{1'}$ and $X^{2'}$ each independently represent a single bond, an alkylene group of 1 to 10 carbon atoms which may have a branched structure, or a group of formula (14'):

[Chemical Formula 13]

(14')

wherein $R^{98'}$ to $R^{101'}$ each independently representing a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ each independently representing a single bond or an alkylene group of 1 to 10 carbon atoms which may have a branched structure;

13. The triazine ring-containing polymer of any one of 1 to 12 above which has at least one diamine end, wherein at least one such diamine end is capped with an acyl group, an alkoxycarbonyl group, an aralkyloxycarbonyl group or an aryloxycarbonyl group;

14. A triazine polymer-containing composition comprising the triazine ring-containing polymer of any one of 1 to 13 above and an organic solvent;

15. The triazine polymer-containing composition of 14 above which further comprises a crosslinking agent;

16. The triazine polymer-containing composition of 15 above, wherein the crosslinking agent is a poly(meth)acrylic compound;

17. The triazine polymer-containing composition of 15 or 16 above for use in forming a cured film or in patterning;

18. A cured film obtained by curing the triazine polymer-containing composition of any one of 14 to 17 above;

19. A pattern produced from the triazine polymer-containing composition of any one of 15 to 17 above;

20. An electronic device comprising a substrate material and the cured film of 18 above formed on the substrate;

21. An optical member comprising a substrate and the cured film of 18 above formed on the substrate; and 22. An electronic device comprising a substrate and the pattern of 19 above formed on the substrate.

Advantageous Effects of the Invention

This invention enables a thin film having a high refractive index and excellent transparency to be formed, and also enables a fine pattern to be formed by masking, light exposure and curing of the film, followed by a process such as alkali development.

Cured films and fine patterns produced from the inventive composition are able to exhibit the properties of high heat resistance, high refractive index and low volume shrinkage owing to the crosslinked triazine ring-containing polymer. Hence, they can be advantageously used in the fields of electronic devices and optical materials as, for example, components in the fabrication of liquid-crystal displays, organic EL displays, touch panels, LED devices, solid-state image sensors, organic thin-film solar cells, dye-sensitized solar cells, thin-film transistors (TFTs), lenses, prisms, cameras, binoculars, microscopes, semiconductor steppers and the like.

In particular, because cured films and fine patterns produced from the inventive composition have a high transparency and also a high index of refraction, the visibility of transparent conductive films made of indium tin oxide (ITO), silver nanowires or the like can be improved and deterioration of the transparent conductive film can be minimized.

Moreover, high refractive index patterns produced from the inventive composition can be advantageously used in applications for which high refractive index patterns are required, such as to prevent the transparent electrodes in the above touch panels and the like from being visually apparent, light extraction applications for organic EL displays, and black matrix applications.

BRIEF DESCRIPTION OF THE DIAGRAMS

EMBODIMENT FOR CARRYING OUT THE INVENTION

Figure 1:
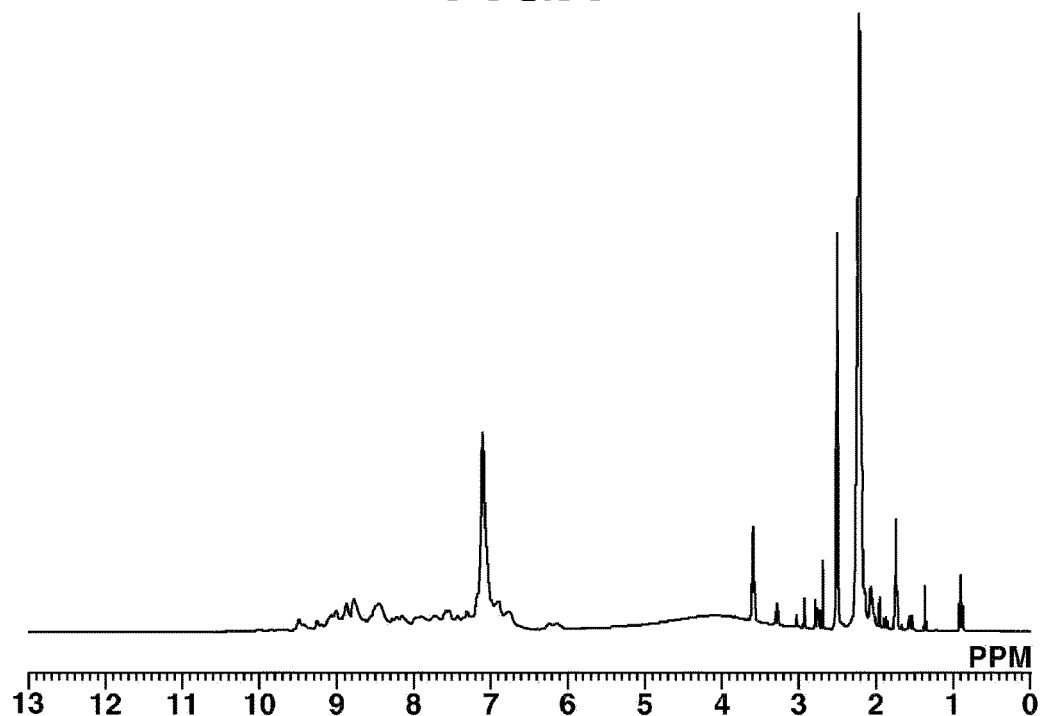
FIG. 1 shows the $^1$H-NMR spectrum for Polymer Compound [5] obtained in Working Example 1.

The invention is described more fully below.

The triazine ring-containing polymer of this invention includes a recurring unit structure of formula (1) below.

[Chemical Formula 14]

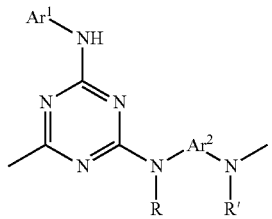

(1)

In the formula, R and R' each independently represent a hydrogen atom, an alkyl group, an alkoxy group, an aryl group or an aralkyl group. From the standpoint of further increasing the refractive index, both are preferably hydrogen atoms.

In the invention, the number of carbon atoms on the alkyl group, although not particularly limited, is preferably from 1 to 20. To further increase the heat resistance of the polymer, the number of carbon atoms is more preferably from 1 to 10, and even more preferably from 1 to 3. The structure may be acyclic, branched or cyclic.

Illustrative examples of the alkyl group include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl groups.

The number of carbon atoms on the alkoxy group, although not particularly limited, is preferably from 1 to 20. To further increase the heat resistance of the polymer, the number of carbon atoms is more preferably from 1 to 10, and even more preferably from 1 to 3. The structure of the alkyl moiety thereon may be acyclic, branched or cyclic.

Illustrative examples of the alkoxy group include methoxy, ethoxy, n-propoxy, isopropoxy, n-butoxy, isobutoxy, s-butoxy, t-butoxy, n-pentyloxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy groups.

The number of carbon atoms on the aryl group, although not particularly limited, is preferably from 6 to 40. To further increase the heat resistance of the polymer, the number of carbon atoms is more preferably from 6 to 16, and even more preferably from 6 to 13.

Illustrative examples of the aryl group include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl groups.

The number of carbon atoms on the aralkyl group, although not particularly limited, is preferably from 7 to 20. The alkyl moiety thereon may be acyclic, branched or cyclic.

Illustrative examples include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl groups.

Ar$^1$ represents an aryl group which may be substituted with an alkyl, alkoxy, aryl, aralkyl or carboxyl group. In the case of a polymeric compound consisting solely of recurring unit structures of formula (1), from the standpoint of ensuring the solubility of the triazine ring-containing polymer in resist solvents and other solvents having a high safety, Ar$^1$ is preferably a phenyl group substituted with an alkyl, alkoxy, aryl or aralkyl group.

The substituent is preferably an alkyl group of 1 to 20 carbon atoms, more preferably an alkyl group of 1 to 10 carbon atoms, and even more preferably an alkyl group of 1 to 5 carbon atoms.

These alkyl, alkoxy, aryl and aralkyl groups are exemplified by the same groups as mentioned above.

Although the number of substituents and the substitution sites are not particularly limited, to enhance the solubility of the triazine ring-containing polymer in resist solvents and other solvents having a high safety, the presence of at least one substituent at a meta position or ortho position with respect to the NH group on $Ar^1$ is preferred, the presence of a substituent on at least one ortho position is more preferred, and the presence of substituents at both ortho positions is even more preferred.

From these standpoints, $Ar^1$ is preferably an aryl group having an alkyl group of 1 to 20 carbon atoms on at least one ortho position with respect to the NH group on $Ar^1$, more preferably a phenyl group having alkyl groups of 1 to 5 carbon atoms at both ortho positions, and most preferably the phenyl group having methyl groups at both ortho positions that is shown in formula (15).

[Chemical Formula 15]

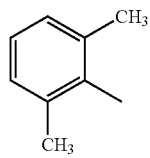
(15)

$Ar^2$ represents at least one moiety selected from the group consisting of moieties of formulas (2) to (13).

[Chemical Formula 16]

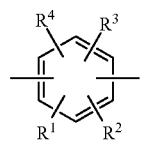
(2)

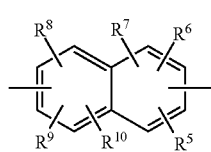
(3)

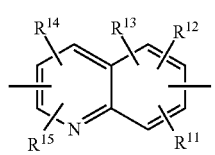
(4)

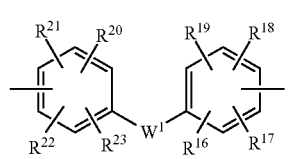
(5)

-continued

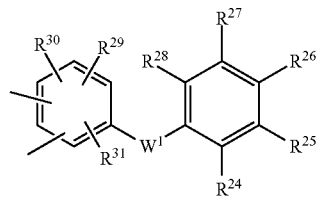
(6)

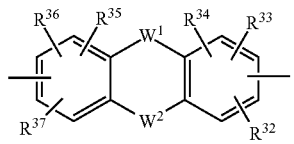
(7)

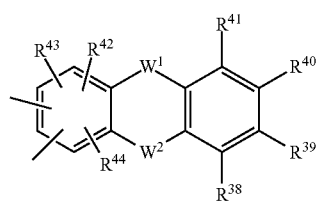
(8)

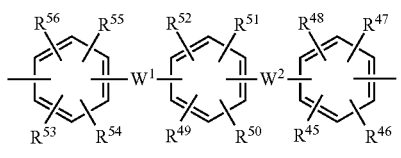
(9)

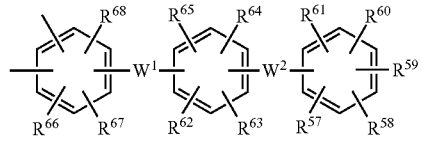
(10)

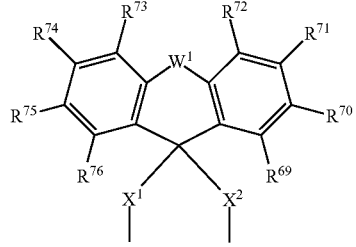
(11)

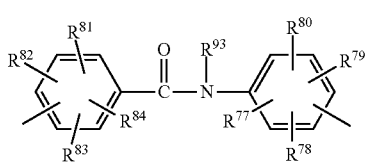
(12)

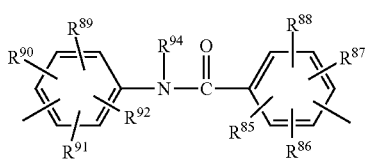
(13)

$R^1$ to $R^{92}$ above each independently represent a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; $R^{93}$ and $R^{94}$ each represent a hydrogen atom or an alkyl group of 1 to 10 carbon atoms which may have a branched structure; and $W^1$ and $W^2$ each independently represent a single bond, $CR^{95}R^{96}$, C=O, O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure.

Examples of the halogen atom include fluorine, chlorine, bromine and iodine atoms.

The alkyl groups and alkoxy groups are exemplified in the same way as above.

Also, $X^1$ and $X^2$ each independently represent a single bond, an alkylene group of 1 to 10 carbon atoms which may have a branched structure, or a group of formula (14).

[Chemical Formula 17]

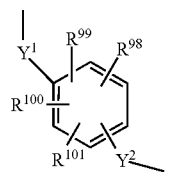

(14)

$R^{98}$ to $R^{101}$ above each independently represent a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; and $Y^1$ and $Y^2$ each independently represent a single bond or an alkylene group of 1 to 10 carbon atoms which may have a branched structure. These halogen atoms, alkyl groups and alkoxy groups are exemplified in the same way as above.

The alkylene group of 1 to 10 carbon atoms which may have a branched structure is exemplified by methylene, ethylene, propylene, trimethylene, tetramethylene and pentamethylene groups.

In this invention, to increase the solubility of the resulting thin film or cured film in an alkali developing solution, the recurring unit structure of formula (1) has, on either or both of $Ar^1$ and $Ar^2$, at least one carboxyl group on an aromatic ring. From the standpoint of, for example, the simplicity of the production process, it is preferable for the recurring unit structure of formula (1) to have at least one carboxyl group on an aromatic ring of $Ar^2$.

What is meant by the recurring unit structure of formula (1) having at least one carboxyl group on an aromatic ring of $Ar^2$ is that formulas (2) to (13) all have at least one carboxyl group on at least one aromatic ring thereof. Specifically, this means that at least one of $R^1$ to $R^4$ in formula (2) is a carboxyl group, at least one of $R^5$ to $R^{10}$ in formula (3) is a carboxyl group, at least one of $R^{11}$ to $R^{15}$ in formula (4) is a carboxyl group, at least one of $R^{16}$ to $R^{23}$ in formula (5) is a carboxyl group, at least one of $R^{24}$ to $R^{31}$ in formula (6) is a carboxyl group, at least one of $R^{32}$ to $R^{37}$ in formula (7) is a carboxyl group, at least one of $R^{38}$ to $R^{44}$ in formula (8) is a carboxyl group, at least one of $R^{45}$ to $R^{56}$ in formula (9) is a carboxyl group, at least one of $R^{57}$ to $R^{68}$ in formula (10) is a carboxyl group, at least one of $R^{69}$ to $R^{76}$ in formula (11) is a carboxyl group (when $X^1$ and/or $X^2$ has formula (14), at least one of $R^{69}$ to $R^{76}$ and $R^{98}$ to $R^{101}$ is a carboxyl group), at least one of $R^{77}$ to $R^{84}$ in formula (12) is a carboxyl group, and at least one of $R^{85}$ to $R^{92}$ in formula (13) is a carboxyl group.

Although the number of carboxyl groups is not particularly limited, taking into account the balance between developability in an alkali developing solution and solubility in an organic solvent, it is preferable for there to be one carboxyl group in all the moieties represented by formulas (2) to (13).

In particular, $Ar^2$ is preferably at least one moiety of formula (2) and formulas (5) to (13), and more preferably at least one moiety of formulas (2), (5), (7), (8) and (11) to (13). Specific examples of moieties of formulas (2) to (13) include, but are not limited to, those having the formulas shown below.

[Chemical Formula 18]

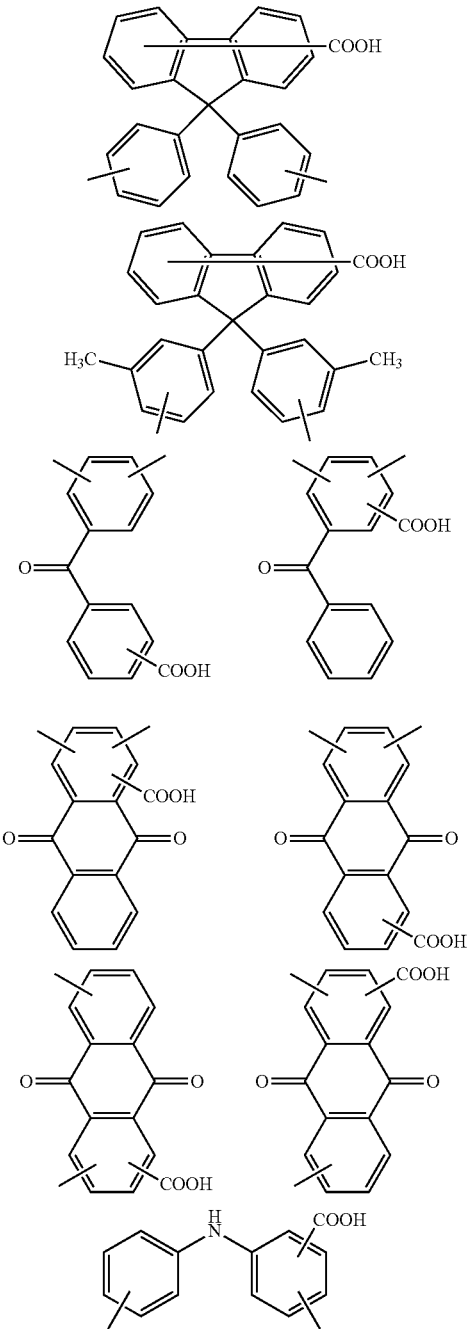

-continued
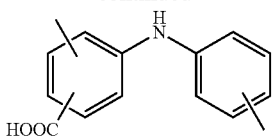
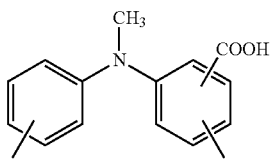
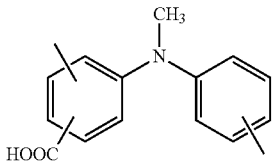
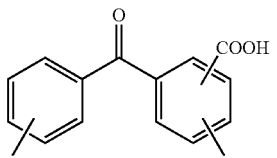
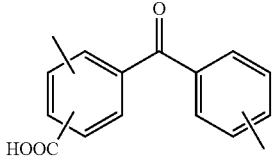
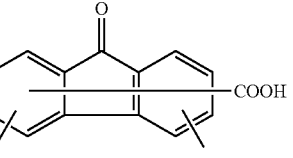
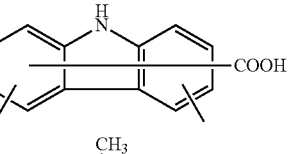
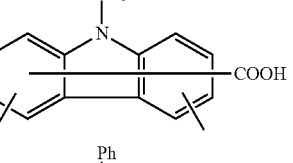
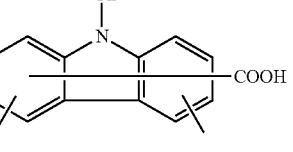
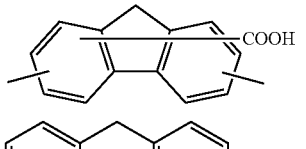
-continued
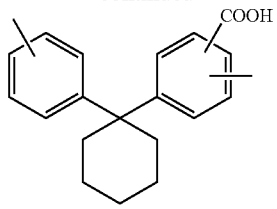
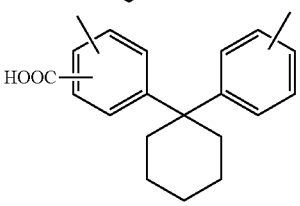
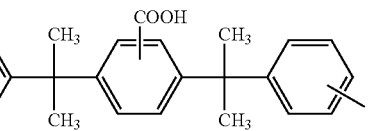
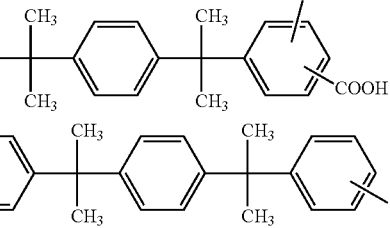
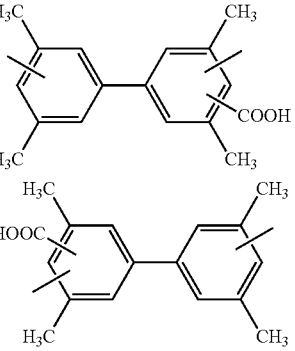
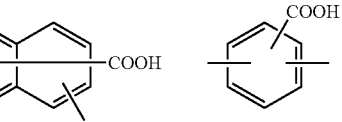
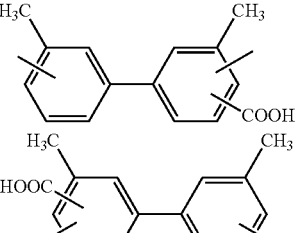
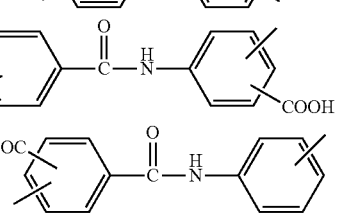

-continued
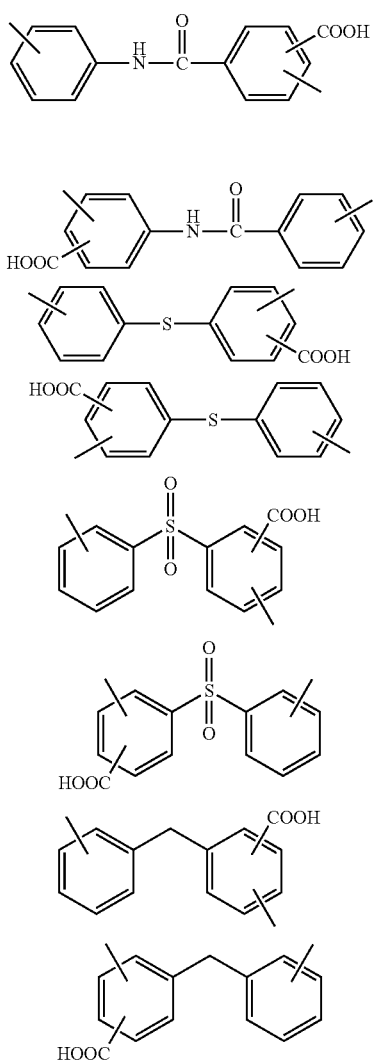
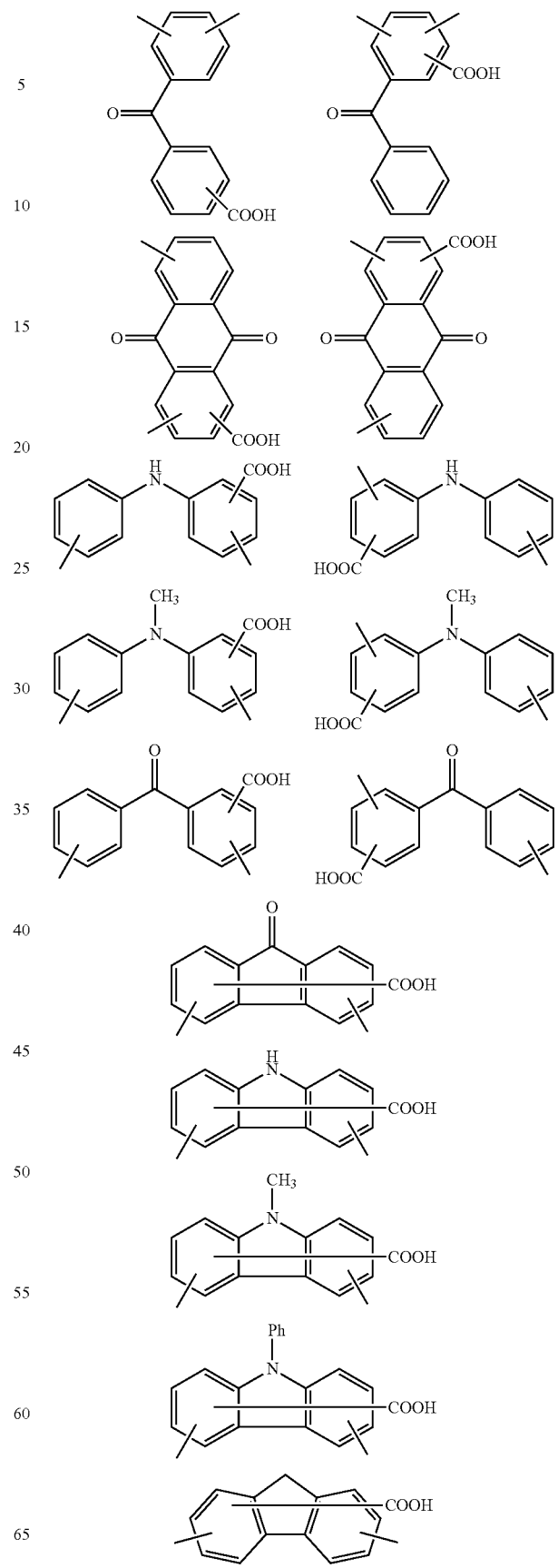
Of these, aryl groups of the following formulas are more preferred because a polymer having a higher refractive index can be obtained.
[Chemical Formula 19]
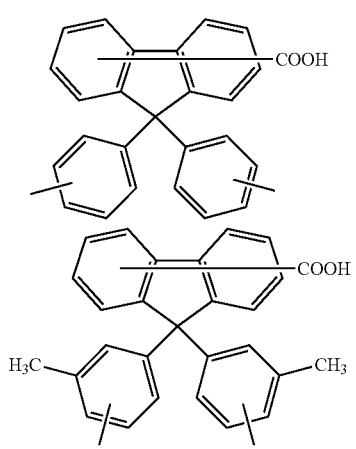

-continued

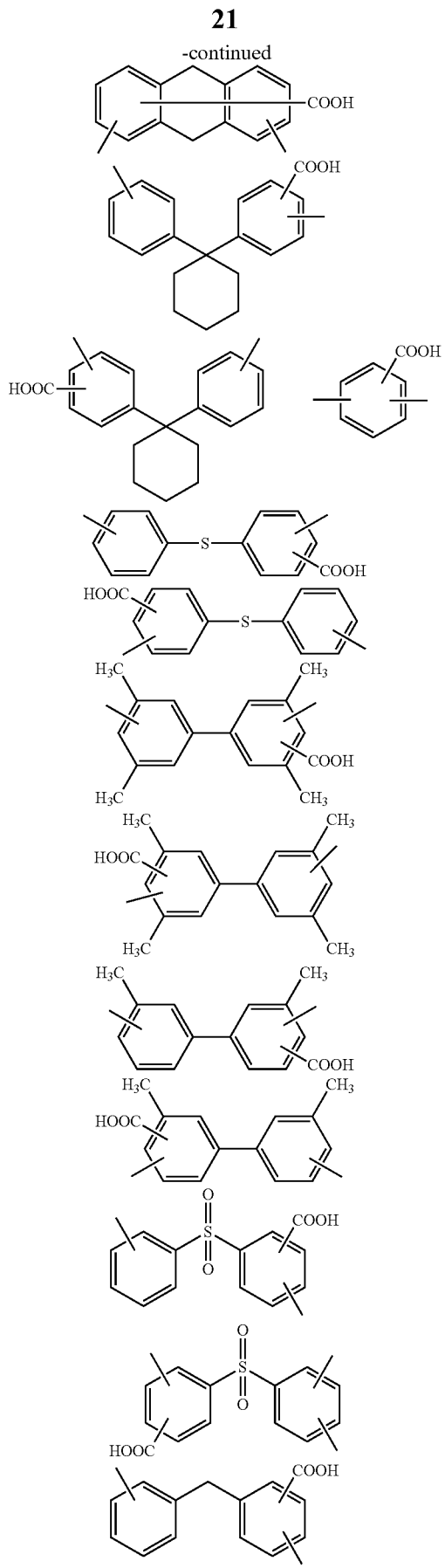

-continued

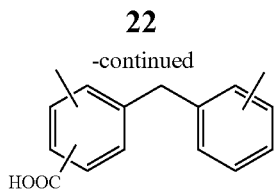

In addition, taking into account the balance between developability in an alkali developing solution and solubility in an organic solvent, $Ar^2$ is preferably a group of formula (16), and more preferably the group of formula (17).

[Chemical Formula 20]

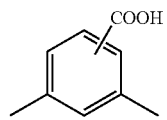
(16)

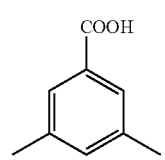
(17)

The triazine ring-containing polymer of the invention may be one consisting solely of recurring units of formula (1), although it preferably includes, together with the recurring unit structure of formula (1), recurring units represented by formula (1') that are obtained using a diamine having no carboxyl groups.

By having the triazine ring-containing polymer of the invention be such a copolymer in which two different types of diamines are used together, the solubility of the polymer in a resist solvent or other solvent having a high safety can be further increased.

[Chemical Formula 21]

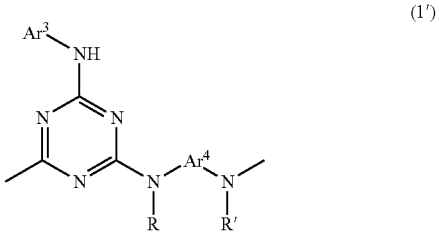
(1')

In formula (1'), R and R' are as defined above, $Ar^3$ represents an aryl group substituted with an alkyl, alkoxy, aryl or aralkyl group, and $Ar^4$ represents at least one moiety selected from the group consisting of moieties of formulas (2') to (13') below.

The alkyl, alkoxy, aryl and aralkyl groups are exemplified in the same way as above.

[Chemical Formula 22]

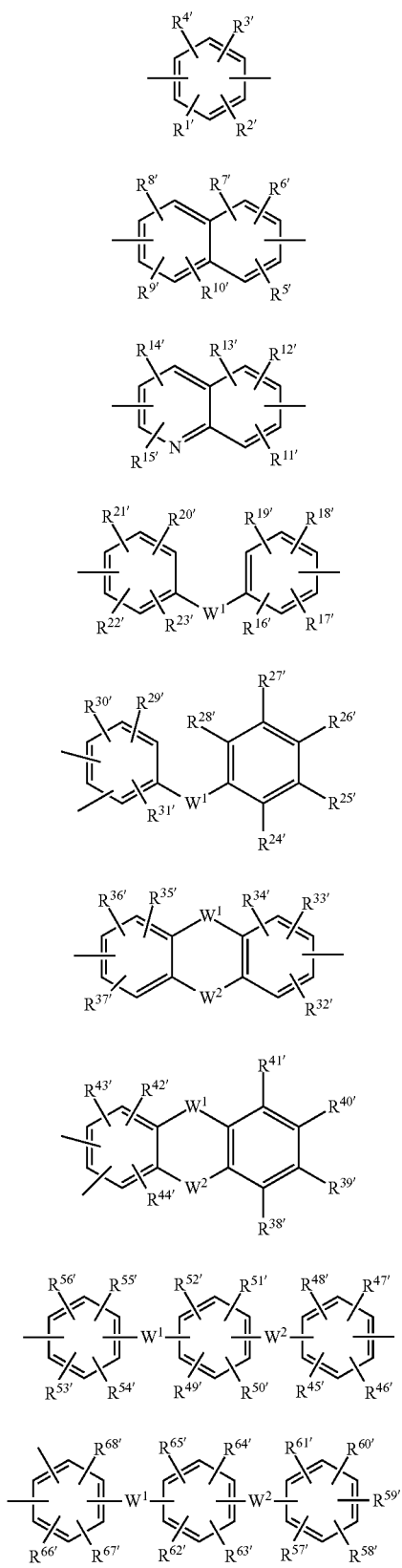

(2')
(3')
(4')
(5')
(6')
(7')
(8')
(9')
(10')

-continued

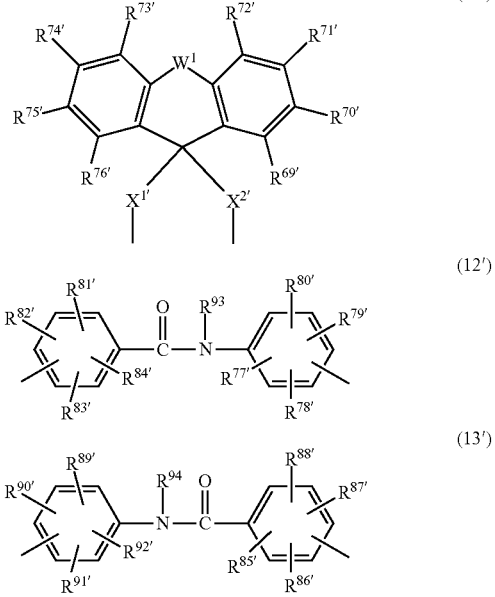

(11')
(12')
(13')

Here, $R^{1'}$ to $R^{92'}$ each independently represent a hydrogen atom, a halogen atom, a sulfo group, an alkyl group of 1 to 10 carbons which may have a branched structure, or an alkoxy group of 1 to 10 carbons which may have a branched structure; $R^{93}$ and $R^{94}$ each represent a hydrogen atom or an alkyl group of 1 to 10 carbons which may have a branched structure; and $W^1$ and $W^2$ each independently represent a single bond, $CR^{95}R^{96}$, C=O, O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure. These halogen atoms, alkyl groups and alkoxy groups are exemplified in the same way as above.

Also, $X^{1'}$ and $X^{2'}$ each independently represent a single bond, an alkylene group of 1 to 10 carbon atoms which may have a branched structure, or a group of formula (14').

[Chemical Formula 23]

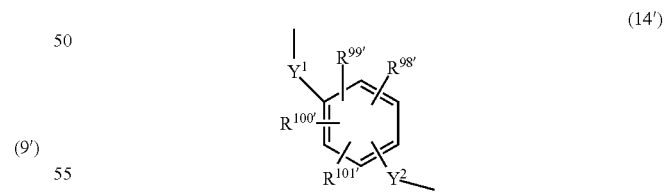

(14')

Here, $R^{98'}$ to $R^{101'}$ each independently represent a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ are as defined above. These halogen atoms, alkyl groups and alkoxy groups are exemplified in the same way as above.

In particular, $Ar^4$ is preferably at least one moiety of formula (2') and formulas (5') to (13'), and more preferably at least one moiety of formulas (2'), (5'), (7'), (8') and (11')

to (13'). Specific examples of moieties of formulas (2') to (13') include, but are not limited to, those having the formulas shown below.
[Chemical Formula 24]
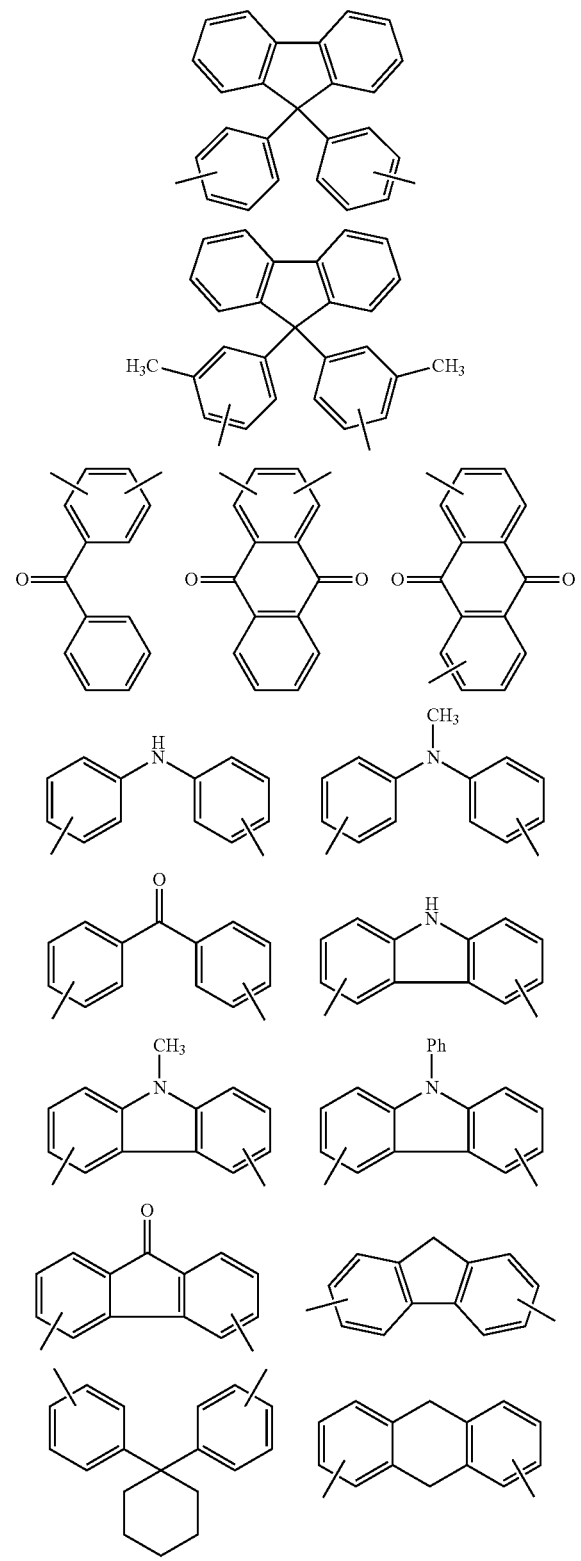
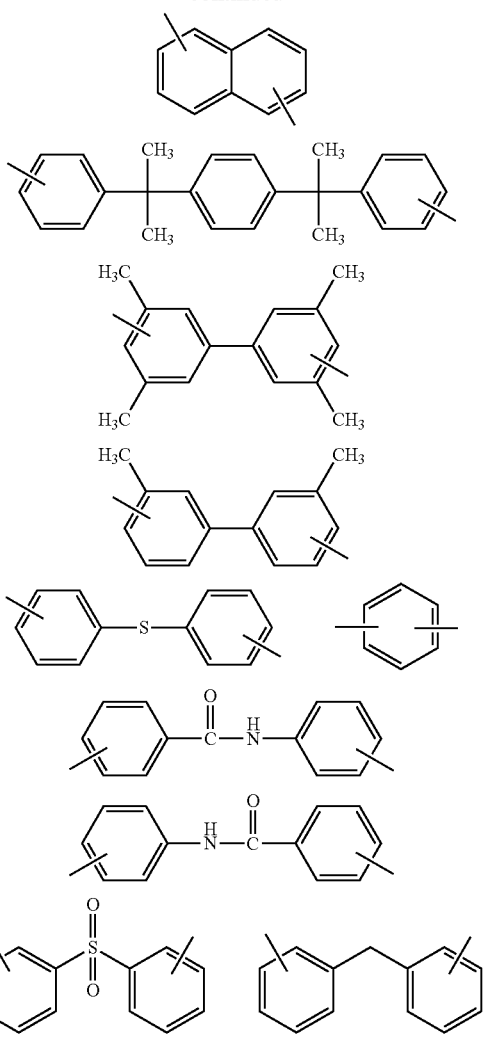
Of these, aryl groups of the following formulas are more preferred because a polymer having a higher refractive index can be obtained.
[Chemical Formula 25]
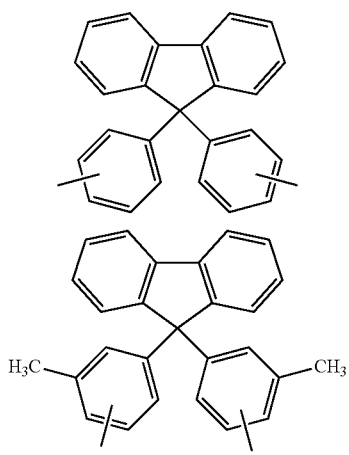

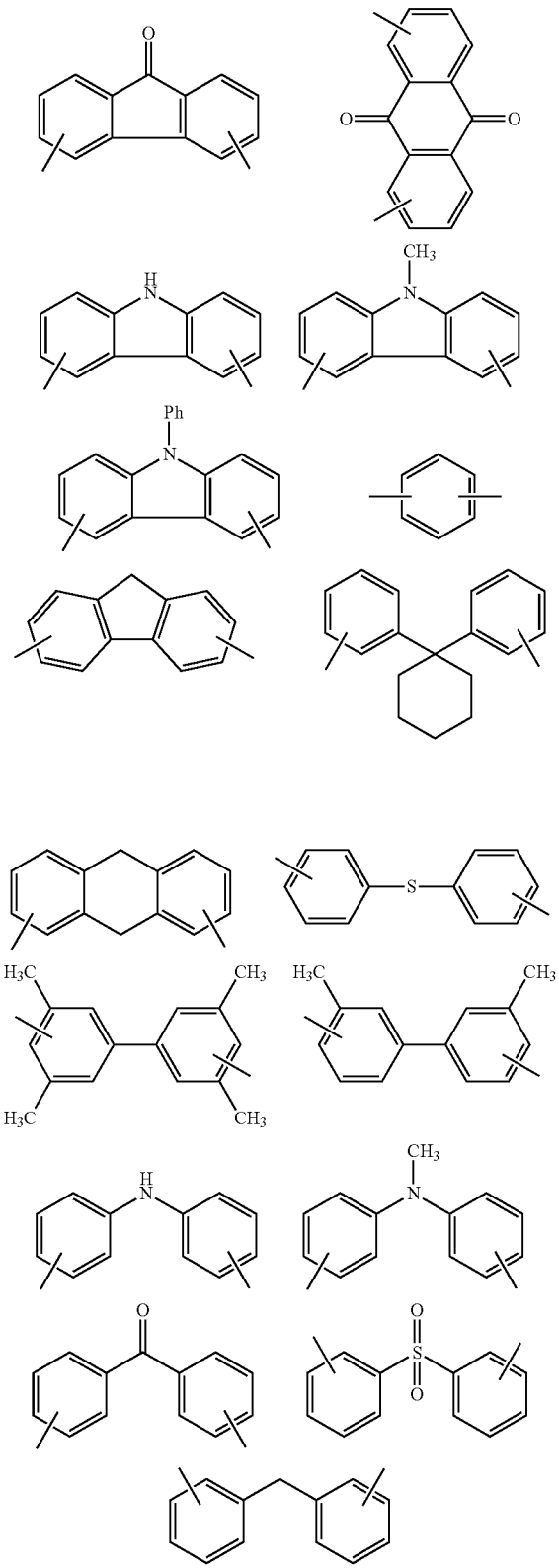

In particular, to further increase the solubility of the triazine ring-containing polymer in resist solvents and other solvents of high safety, Ar⁴ is preferably the m-phenylene group shown in formula (18).

[Chemical Formula 26]

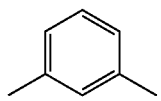

(18)

When the polymer is such a copolymer, the ratio of the content of recurring units of formula (1) to the content of recurring units of formula (1') is not particularly limited. However, taking into account the balance between the alkali solubility and the solubility in organic solvents, this ratio, expressed as a molar ratio, is preferably from about 50:50 to about 99:1, more preferably from 60:40 to 90:10, and even more preferably from 65:35 to 80:20.

In addition, together with the recurring unit structure of formula (1), it is preferable to include recurring units of formula (1") which can be obtained using an amine having no substituents and a diamine having no carboxyl groups.

By having the polymer include this recurring unit structure, it is possible to suppress a decline in the refractive index.

[Chemical Formula 27]

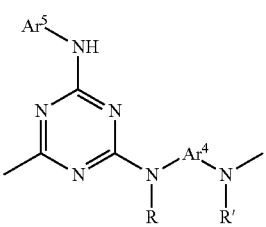

(1")

In formula (1"), R, R' and Ar⁴ are as defined above, and Ar⁵ represents an unsubstituted aryl group.

This aryl group is exemplified in the same way as above, with a phenyl group being preferred.

When the polymer is such a copolymer, the ratio of the content of recurring units of formula (1) to the content of recurring units of formula (1") (that is, the ratio of the content of carboxyl group-containing diamine used to the content of carboxyl group-lacking diamine used) is not particularly limited. However, taking into account both the balance between the alkali solubility and the solubility in organic solvents and also the index of refraction, this ratio, expressed as a molar ratio, is preferably from about 50:50 to about 99:1, more preferably from 60:40 to 90:10, and even more preferably from 65:35 to 80:20.

Also, when the polymer is a ternary copolymer that includes recurring units of formula (1), recurring units of formula (1') and recurring units of formula (1"), the ratio of the content of recurring units of formula (1) to the content of recurring units of formula (1') to the content of recurring units of formula (1") is not particularly limited. However, taking into account both the balance between the alkali solubility and the solubility in organic solvents and also the index of refraction, this ratio, expressed as a molar ratio, is preferably from about 50:10:40 to about 98:1:1, more preferably from 60:10:30 to 90:5:5, and even more preferably from 65:5:30 to 90:5:5.

In this invention, examples of especially preferred triazine ring-containing polymers include those of formulas (19) to (34) below:

[Chemical Formula 28]

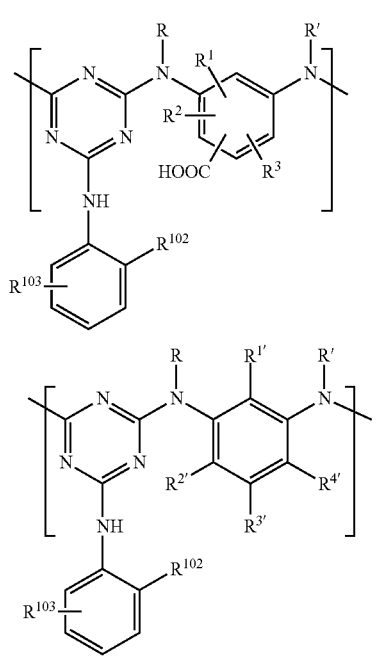

(19)

(wherein R, R', R$^1$ to R$^3$ and R$^{1'}$ to R$^{4'}$ are as defined above, and R$^{102}$ and R$^{103}$ each independently represent an alkyl group of 1 to 5 carbon atoms, which alkyl group is exemplified by those alkyl groups mentioned above which have 1 to 5 carbon atoms);

[Chemical Formula 29]

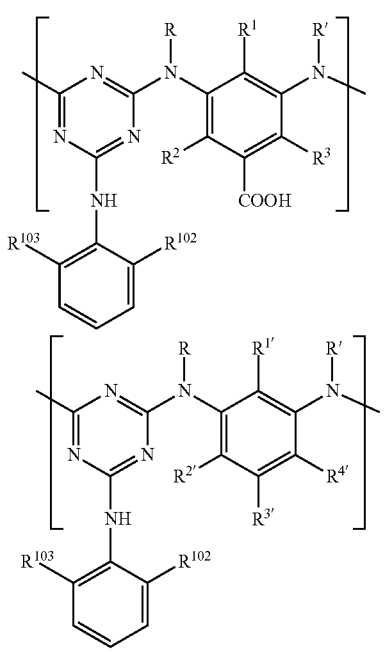

(20)

(wherein R, R', R$^1$ to R$^3$, R$^{1'}$ to R$^{4'}$, and R$^{102}$ and R$^{103}$ are as defined above);

[Chemical Formula 30]

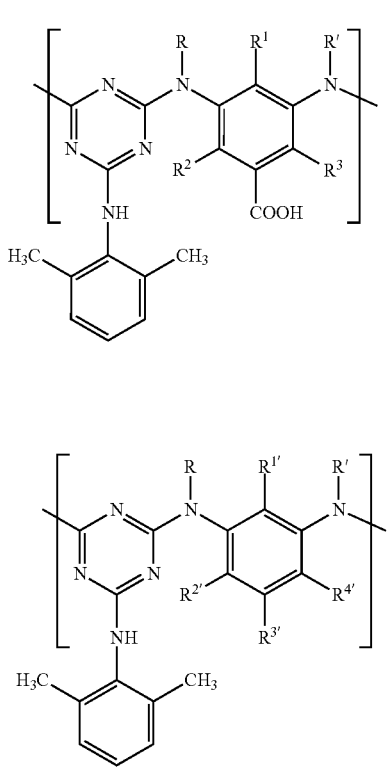

(21)

(wherein R, R', R$^1$ to R$^3$ and R$^{1'}$ to R$^{4'}$ are as defined above);

[Chemical Formula 31]

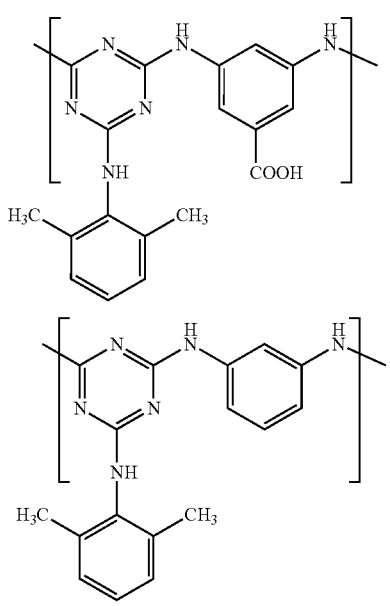

(22)

[Chemical Formula 32]

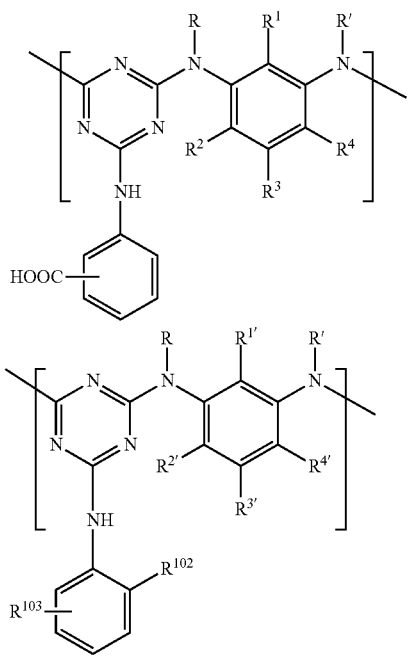

(23)

(wherein R, R', $R^1$ to $R^4$ and $R^{1'}$ to $R^{4'}$ are as defined above, and $R^{102}$ and $R^{103}$ each independently represent an alkyl group of 1 to 5 carbon atoms, which alkyl group is exemplified by those alkyl groups mentioned above which have 1 to 5 carbon atoms);

[Chemical Formula 33]

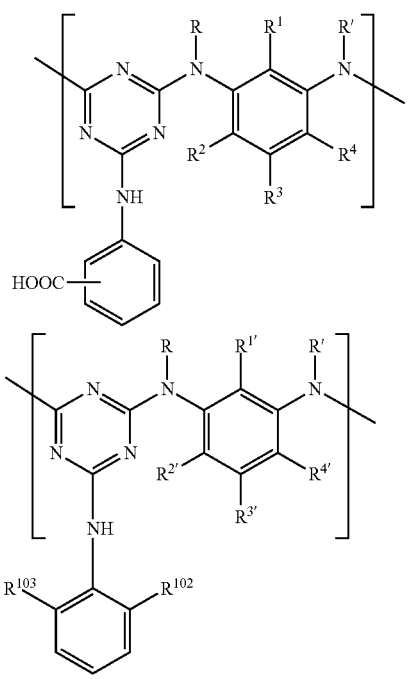

(24)

(wherein R, R', $R^1$ to $R^4$, $R^{1'}$ to $R^{4'}$, and $R^{102}$ and $R^{103}$ are as defined above);

[Chemical Formula 34]

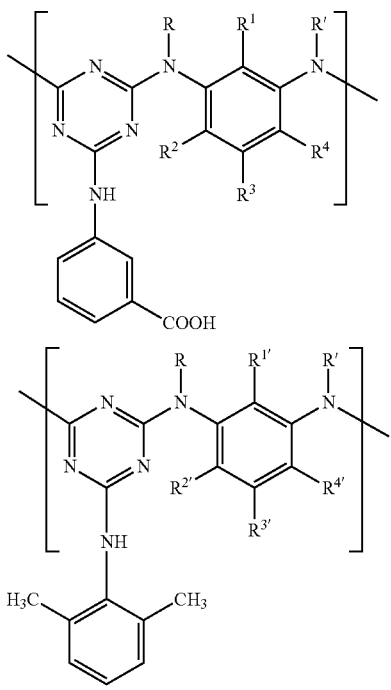

(25)

(wherein R, R', $R^1$ to $R^4$, and $R^{1'}$ to $R^{4'}$ are as defined above);

[Chemical Formula 35]

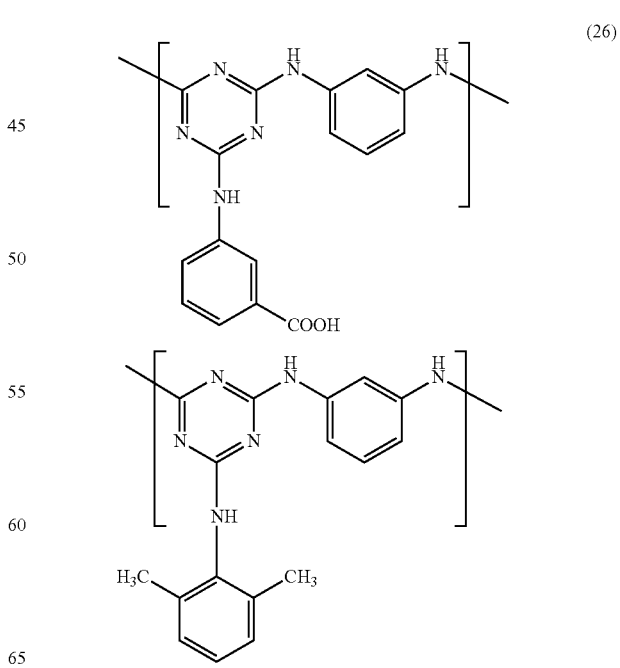

(26)

[Chemical Formula 36]
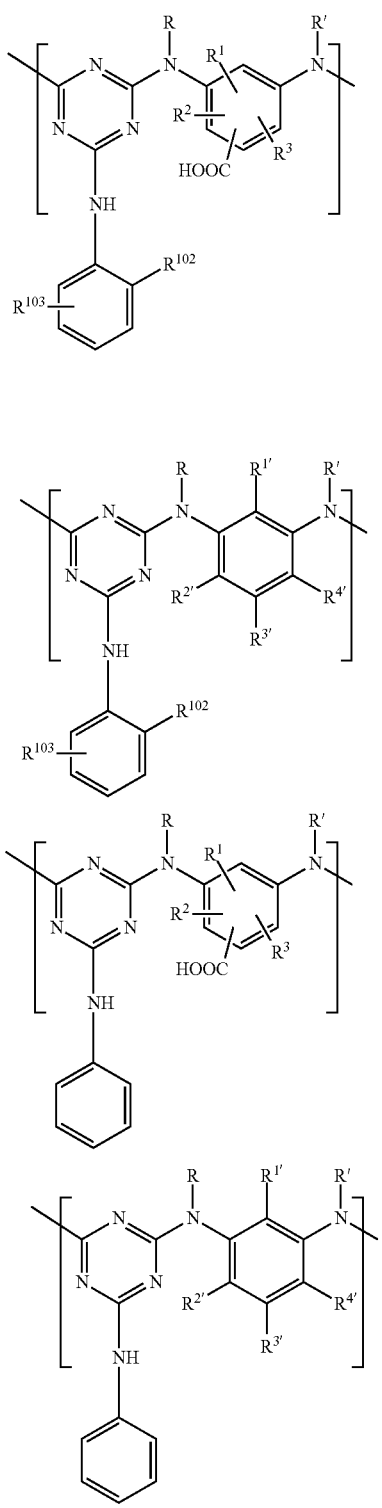
(27)
(wherein R, R', R¹ to R³ and R¹' to R⁴' are as defined above, and $R^{102}$ and $R^{103}$ each independently represent an alkyl group of 1 to 5 carbon atoms, which alkyl group is exemplified by those alkyl groups mentioned above which have 1 to 5 carbon atoms);
[Chemical Formula 37]
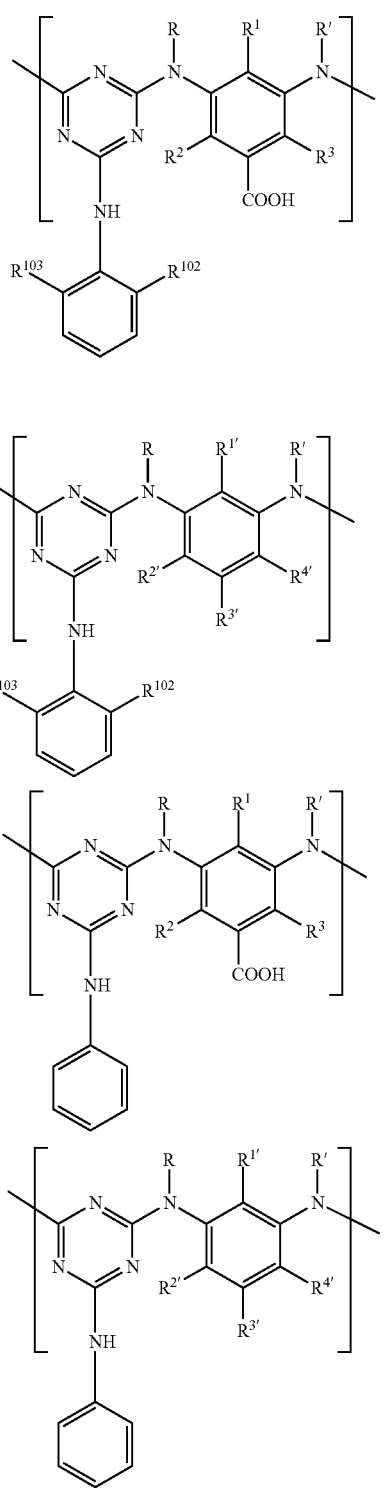
(28)
(wherein R, R', R¹ to R³, R¹' to R⁴', and $R^{102}$ and $R^{103}$ are as defined above);

[Chemical Formula 38]
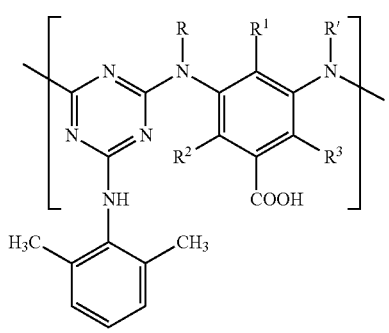
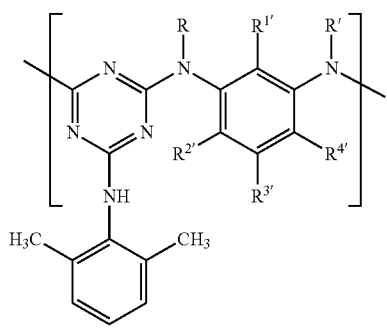
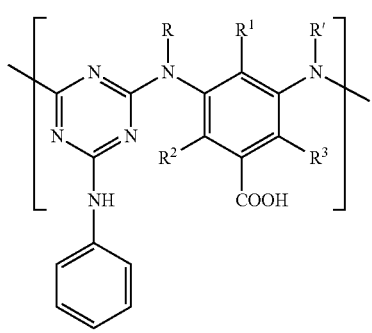
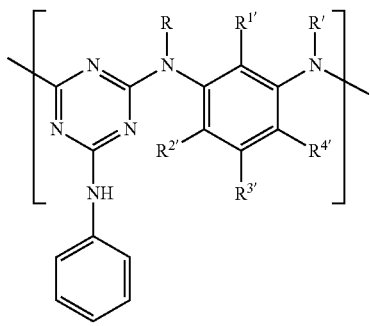
(wherein R, R', R¹ to R³, and R¹' to R⁴' are as defined above);
[Chemical Formula 39]
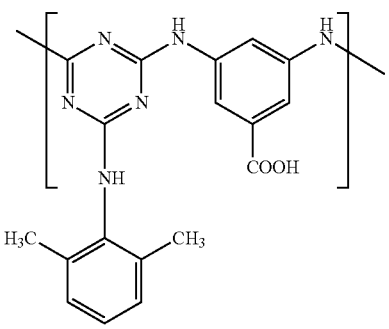
(29)
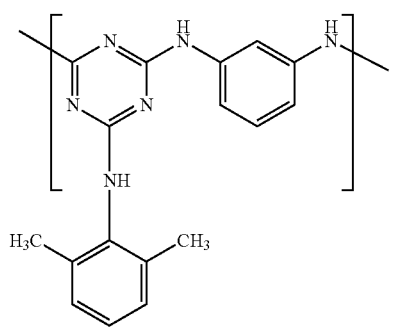
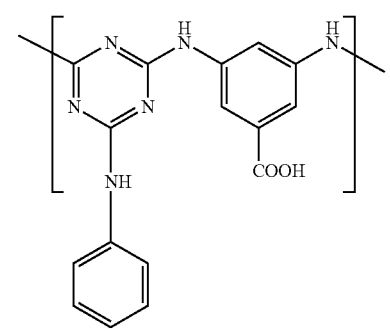
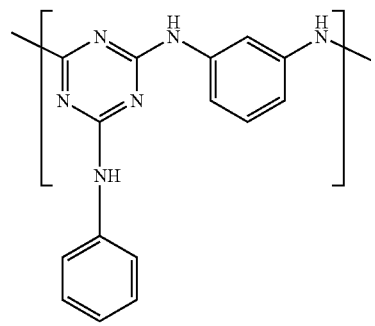
(30)

-continued

[Chemical Formula 40]

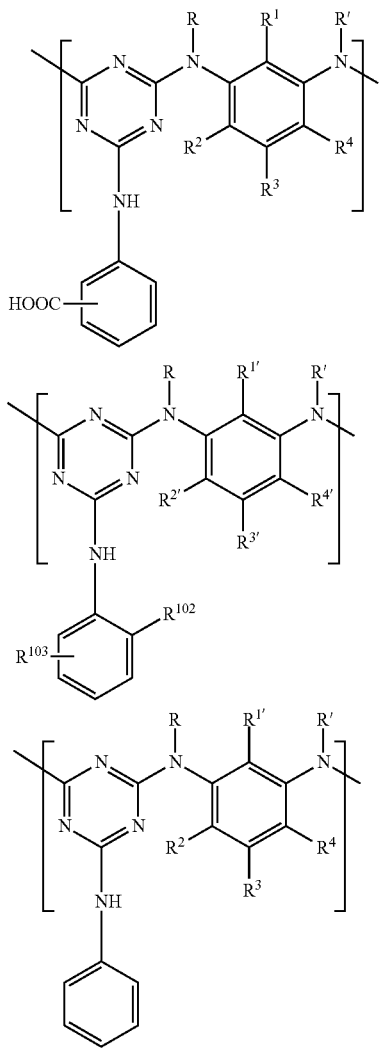

(31)

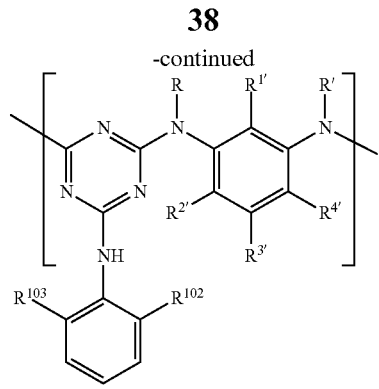

(wherein R, R', R¹ to R⁴ and R¹' to R⁴' are as defined above, and $R^{102}$ and $R^{103}$ each independently represent an alkyl group of 1 to 5 carbon atoms, which alkyl group is exemplified by those alkyl groups mentioned above which have 1 to 5 carbon atoms);

[Chemical Formula 41]

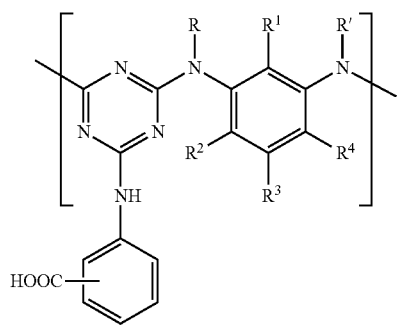

(32)

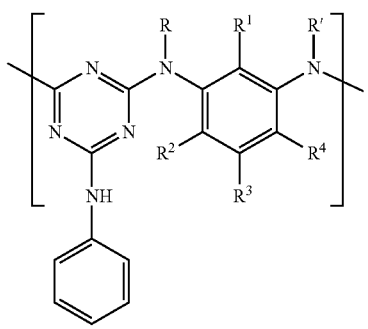

(wherein R, R', R¹ to R⁴, R¹' to R⁴', and $R^{102}$ and $R^{103}$ are as defined above);

[Chemical Formula 42]

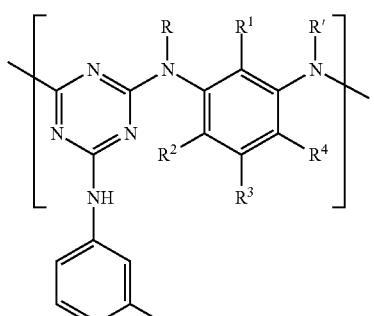

(33)

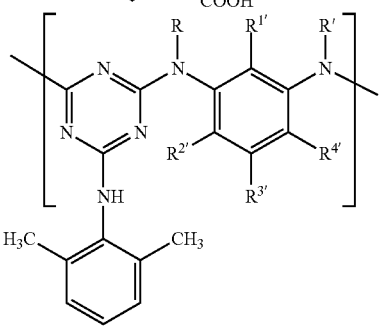

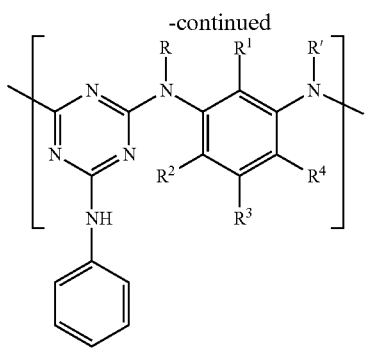

(wherein R, R', $R^1$ to $R^4$, and $R^{1'}$ to $R^{4'}$ are as defined above); and

[Chemical Formula 43]

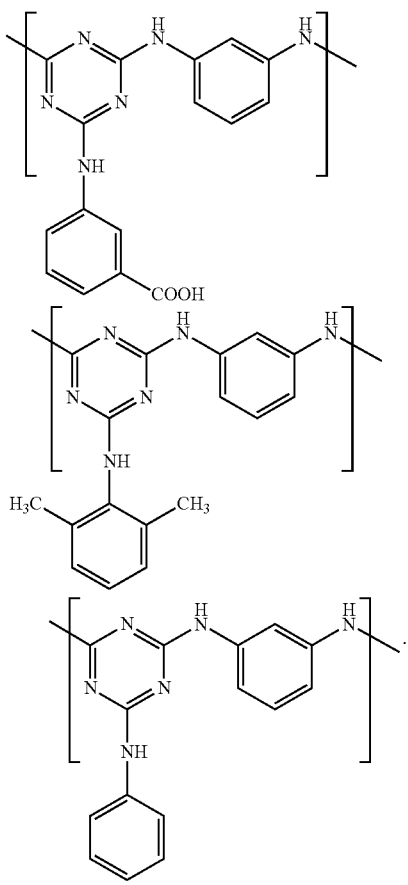

The polymer of the invention has a weight-average molecular weight (Mw) which, although not particularly limited, is preferably between 500 and 500,000, and more preferably between 500 and 100,000. To further enhance the heat resistance and lower the shrinkage ratio, the Mw is preferably at least 2,000. To further increase the solubility and lower the viscosity of the resulting solution, the Mw is preferably 50,000 or less, more preferably 30,000 or less, and even more preferably 10,000 or less.

In this invention, Mw is the average molecular weight measured by gel permeation chromatography (GPC) against a polystyrene standard.

The triazine ring-containing polymer of the invention may be prepared by the method disclosed in above-cited Patent Document 1.

For example, as shown in Scheme 1 below, a triazine ring-containing polymer (22) can be obtained by reacting a triazine compound (27) with an arylamino compound (28) in a suitable organic solvent, and then reacting the product with an aryldiamino compound (29) having a carboxyl group and an aryldiamino compound (30) lacking a carboxyl group in a suitable organic solvent.

Scheme 1

[Chemical Formula 44]

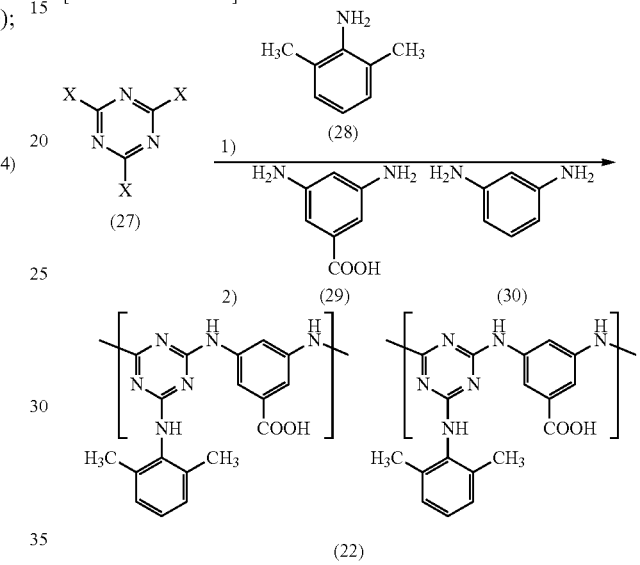

In the above formulas, each X independently represents a halogen atom.

In the first stage reaction above, the respective starting materials are charged in amounts which are not particularly limited, although it is preferable to charge 1 equivalent of the arylamino compound (28) per equivalent of the triazine compound (27).

The reaction temperature should be suitably set in the range from the melting point to the boiling point of the solvent used, although the temperature is preferably from about −30° C. to about 50° C., and more preferably from −10° C. to 30° C.

The ingredients may be added in any order, although the method of adding the arylamino compound (28) to a solution containing the triazine compound (27) and an organic solvent is preferred.

The arylamino compound (28) may be added neat or may be added as a solution obtained by dissolution in an organic solvent. However, taking into account the ease of operation and the controllability of the reaction, the latter approach is preferred.

Also, addition may be carried out gradually such as in a dropwise manner, or the entire amount may be added all at once in a batchwise manner.

In the second stage reaction above, the aryldiamino compounds (29) and (30) may be charged in any ratio so long as the target polymer can be obtained, although the combined amount of aryldiamino compounds (29) and (30) per equivalent of the triazine compound (27) is preferably from 0.01 to 10 equivalents, and more preferably from 1 to 5 equivalents.

As mentioned above, the charging ratio of the carboxyl group-containing aryldiamino compound (29) and the carboxyl group-lacking aryldiamino compound (30), expressed as the molar ratio "aryldiamino compound (29):aryldiamino compound (30)", is preferably from about 50:50 to about 99:1, more preferably from 60:40 to 90:10, and even more preferably from 65:35 to 80:20.

Aryldiamino compounds (29) and (30) may be added neat or may be added as a solution obtained by dissolution in an organic solvent. However, the latter approach is preferred for reasons having to do with the ease of operation and the controllability of the reaction.

The reaction temperature should be suitably set in the range from the melting point to the boiling point of the solvent used, although the temperature is preferably from about −30° C. to about 150° C., and more preferably from −10° C. to 100° C.

Various solvents that are commonly used in this type of reaction may be used as the organic solvent. Illustrative examples include tetrahydrofuran (THF), dioxane, dimethylsulfoxide (DMSO); amide solvents such as N,N-dimethylformamide (DMF), N-methyl-2-pyrrolidone (NMP), tetramethylurea, hexamethylphosphoramide, N,N-dimethylacetamide (DMAc), N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropylene urea; and mixed solvents thereof.

Of these, DMF, DMSO, NMP, DMAc, and mixed solvents thereof are preferred. DMAc and NMP are especially preferred.

In the Scheme 1 reactions above, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, n-propylamine, trimethylamine, triethylamine, diisopropylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the triazine compound (27) is preferably from 1 to 100 equivalents, and more preferably from 1 to 10 equivalents. These bases may be used in the form of an aqueous solution.

It is preferable for there to be no residual starting ingredients within the resulting polymer, although the residual presence of some starting material is acceptable so long as this does not detract from the advantageous effects of the invention.

Following reaction completion, the product can be easily purified by a suitable technique such as re-precipitation.

When producing a triazine ring-containing polymer having carboxyl groups on side chains, in the first stage reaction, the arylamino compound having a carboxyl group and the arylamino compound lacking a carboxyl group are preferably used in the aryldiamino compound (29) to aryldiamino compound (30) ratio indicated above; in the second reaction, the diamino compound lacking a carboxyl group alone should be used. The other reaction conditions are the same as described above.

The triazine ring-containing polymer of the invention has at least one diamine end, and at least one such diamine end may be capped with a carbonyl-containing group such as an acyl group, an alkoxycarbonyl group, an aralkyloxycarbonyl group or an aryloxycarbonyl group. By thus capping an end with a carbonyl-containing group, discoloration of the triazine ring-containing polymer can be suppressed.

Illustrative examples of acyl groups include acetyl, ethylcarbonyl, acryloyl, methacryloyl and benzoyl groups.

Illustrative examples of alkoxycarbonyl groups include methoxycarbonyl, ethoxycarbonyl and t-butoxycarbonyl groups.

An illustrative example of an aralkyloxycarbonyl group is the benzyloxycarbonyl group.

An illustrative example of an aryloxycarbonyl group is the phenoxycarbonyl group.

Of these, an acyl group is preferred as the end-capping group. Taking into account, for example, the availability of the reagent, acryloyl, methacryloyl and acetyl groups are more preferred.

A known method may be used as the end-capping method. For example, the triazine ring-containing polymer (22) obtained by the above method may be treated with an end-capping agent that provides the end-capping group, such as an acid halide or an acid anhydride.

In this case, the amount of end-capping agent used per equivalent of amino groups from the excess diamino compound not utilized in the polymerization reaction is preferably from about 0.05 to about 10 equivalents, more preferably from 0.1 to 5 equivalents, and even more preferably from 0.5 to 2 equivalents.

The triazine ring-containing polymer of the invention can be suitably used, together with a crosslinking agent, as a film-forming composition or a patterning composition.

The crosslinking agent is not particularly limited, provided it is a compound having a substituent which is capable of reacting with the triazine ring-containing polymer.

Such compounds are exemplified by melamine compounds having a crosslink-forming substituent such as a methylol group or a methoxymethyl group, substituted urea compounds, compounds having a crosslink-forming substituent such as an epoxy group or an oxetane group, blocked isocyanate-containing compounds, acid anhydride-containing compounds, compounds having a (meth)acrylic group, and phenoplast compounds. From the standpoint of heat resistance and storage stability, compounds having an epoxy group, a blocked isocyanate group or a (meth)acrylic group are preferred. Compounds having a blocked isocyanate group, and polyepoxy compounds and/or poly(meth)acrylic compounds which provide a photocurable composition even without the use of an initiator are especially preferred.

When used for polymer end group treatment, these compounds should have at least one crosslink-forming substituent. When used for crosslinking treatment between polymers, they must have at least two crosslink-forming substituents.

The polyepoxy compound is not particularly limited, provided it has at least two epoxy groups on the molecule.

Illustrative examples include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis (N,N-diglycidylaniline), 3,4-epoxycyclohexylmethyl-3,4-epoxycyclohexane carboxylate, trimethylolethane triglycidyl ether, bisphenol A diglycidyl ether and pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co., Ltd.); cresol-novolak type epoxy resins such as EOCN-102, 103S, 104S, 1020, 1025 and 1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The poly(meth)acrylic compounds are not particularly limited, provided they have two or more (meth)acrylic groups per molecule.

Illustrative examples include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate, 1,6-hexanediol dimethacrylate and polybasic acid-modified acrylic oligomers.

The poly(meth)acrylic compound may be acquired as a commercial product, illustrative examples of which include NK Ester A-200, A-400, A-600, A-1000, A-9300 (tris(2-acryloyloxyethyl) isocyanurate), A-9300-1CL, A-TMPT, UA-53H, 1G, 2G, 3G, 4G, 9G, 14G, 23G, ABE-300, A-BPE-4, A-BPE-6, A-BPE-10, A-BPE-20, A-BPE-30, BPE-80N, BPE-100N, BPE-200, BPE-500, BPE-900, BPE-1300N, A-GLY-3E, A-GLY-9E, A-GLY-20E, A-TMPT-3EO, A-TMPT-9EO, AT-20E, ATM-4E and ATM-35E (all from Shin-Nakamura Chemical Co., Ltd.); KAYARAD® DPEA-12, PEG400DA, THE-330 and RP-1040 (all from Nippon Kayaku Co., Ltd.); Aronix® M-210 and M-350 (from Toagosei Co., Ltd.); KAYARAD DPHA, NPGDA and PET30 (Nippon Kayaku Co., Ltd.); NK Ester A-DPH, A-TMPT, A-DCP, A-HD-N, TMPT, DCP, NPG and HD-N (all from Shin-Nakamura Chemical Co., Ltd.); NK Oligo U-15HA (Shin-Nakamura Chemical Co., Ltd.); NK Polymer Vanaresin GH-1203 (Shin-Nakamura Chemical Co., Ltd.); and DN-0075 (Nippon Kayaku Co., Ltd.).

The above polybasic acid-modified acrylic oligomers are also available as commercial products, illustrative examples of which include Aronic M-510 and 520 (Toagosei Co., Ltd.).

The acid anhydride compounds are not particularly limited, provided they are carboxylic acid anhydrides obtained by the dehydration/condensation of two molecules of carboxylic acid. Illustrative examples include those having one acid anhydride group per molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and those having two acid anhydride groups per molecule, such as 1,2,3,4-cyclobutanetetracarboxylic dianhydride, pyromellitic anhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The compounds containing blocked isocyanate groups are not particularly limited, provided they are compounds having at least two blocked isocyanate groups per molecule, i.e., isocyanate groups (—NCO) that have been blocked with suitable protecting groups, and in which, upon exposure of the compound to an elevated temperature during heat curing, the protecting groups (blocking moieties) are removed by thermal dissociation and the isocyanate groups that form as a result induce crosslinking reactions with the resin. Such compounds are exemplified by compounds having at least two groups of the following formula (which groups may be the same or may each differ) per molecule.

[Chemical Formula 45]

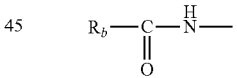

In the formula, $R_b$ is an organic group on the blocking moiety.

Such a compound can be obtained by, for example, reacting a suitable blocking agent with a compound having two or more isocyanate groups per molecule.

Examples of compounds having two or more isocyanate groups per molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Examples of the blocking agent include alcohols such as methanol, ethanol, 2-propanol, 1-butanol, 2-ethoxyhexanol, 2-N,N-dimethylaminoethanol, 2-ethoxyethanol and cyclohexanol; phenols such as phenol, o-nitrophenol, p-chlorophenol, and o-, m- and p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

Compounds containing blocked isocyanate groups may also be acquired as commercial products, examples of which include B-830, B-815N, B-842N, B-870N, B-874N, B-882N, B-7005, B7030, B-7075 and B-5010 (all from Mitsui Chemicals Polyurethanes, Inc.); Duranate® 17B-60PX, TPA-B80E, MF-B60X, MF-K60X and E402-B80T (all from Asahi Kasei Chemicals Corporation); and Karen-zMOI-BM™ (Showa Denko KK).

The aminoplast compounds are not particularly limited, provided they are compounds which have at least two methoxymethylene groups per molecule. Examples include the following melamine compounds: compounds of the Cymel® series, such as hexamethoxymethylmelamine (Cymel® 303), tetrabutoxymethylglycoluril (Cymel® 1170) and tetramethoxymethylbenzoguanamine (Cymel® 1123) (all from Nihon Cytec Industries, Inc.); and compounds of the Nikalac® series, including the methylated melamine resins Nikalac® MW-30HM, MW-390, MW-100LM and MX-750LM, and the methylated urea resins Nikalac® MX-270, MX-280 and MX-290 (all from Sanwa Chemical Co., Ltd.).

The oxetane compounds are not particularly limited, provided they are compounds which have at least two oxetanyl groups per molecule. Examples include the oxetanyl group-bearing compounds OXT-221, OX-SQ-H and OX-SC (from Toagosei Co., Ltd.).

Phenoplast compounds are compounds which have at least two hydroxymethylene groups per molecule. Upon exposure to an elevated temperature during heat curing, crosslinking reactions proceed by way of dehydration/condensation reactions with the polymer of the invention.

Examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

Of these, both in terms of being able to suppress a decline in the refractive index due to inclusion of a crosslinking agent and also rapid progress of the curing reaction, poly(meth)acrylic compounds are preferred. In particular, owing to their excellent compatibility with triazine ring-containing polymers, poly(meth)acrylic compounds having the isocyanuric acid skeleton shown below are more preferred.

Poly(meth)acrylic compounds having such skeletons are exemplified by NK Ester A-9300 and A-9300-1CL (both available from Shin-Nakamura Chemical Co., Ltd.).

[Chemical Formula 46]

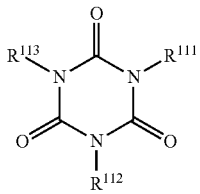

Here, $R^{111}$ to $R^{113}$ are each independently a monovalent organic group having at least one (meth)acrylic group on the end.

To further enhance the rate of cure and also increase the solvent resistance, acid resistance and alkali resistance of the resulting cured film, it is advantageous to use a poly(meth)acrylic compound which at 25° C. is a liquid and has a viscosity of 5,000 mPa·s or less, preferably from 1 to 3,000 mPa·s, more preferably from 1 to 1,000 mPa·s, and even more preferably from 1 to 500 mPa·s (referred to below as a "low-viscosity crosslinking agent"), either singly or as a combination of two or more thereof, or in combination with the above-described poly(meth)acrylic compound having an isocyanuric acid skeleton.

Such a low-viscosity crosslinking agent too may be acquired as a commercial product. Examples include, of the above-mentioned poly(meth)acrylic compounds, crosslinking agents in which the chain lengths between (meth)acrylic groups are relatively long, such as NK Ester A-GLY-3E (85 mPa·s at 25° C.), A-GLY-9E (95 mPa·s at 25° C.), A-GLY-20E (200 mPa·s at 25° C.), A-TMPT-3EO (60 mPa·s at 25° C.), A-TMPT-9EO, ATM-4E (150 mPa·s at 25° C.) and ATM-35E (350 mPa·s at 25° C.) (all from Shin-Nakamura Chemical Co., Ltd.).

In addition, to enhance the alkali resistance of the resulting cured film, it is preferable to use a combination of at least one of NK Ester A-GLY-20E (Shin-Nakamura Chemical Co., Ltd.) and NK Ester ATM-35E (Shin-Nakamura Chemical Co., Ltd.) with the above-described poly(meth)acrylic compound having an isocyanuric acid skeleton.

Also, in cases where a thin-film made of the triazine ring-containing polymer of the invention is laminated onto a protective film such as a PET or polyolefin film and irradiated with light through the protective film, oxygen inhibition does not occur in the laminated film, enabling good curability to be achieved. Because there is a need in such cases to peel off the protective film after curing, it is preferable to use a polybasic acid-modified acrylic oligomer that provides a thin film having a good peelability.

The above crosslinking agent may be used singly, or two or more may be used in combination. The amount of crosslinking agent used per 100 parts by weight of the triazine ring-containing polymer is preferably from 1 to 100 parts by weight. From the standpoint of solvent resistance, the lower limit is preferably 2 parts by weight, and more preferably 5 parts by weight. From the standpoint of control of the refractive index, the upper limit is preferably 20 parts by weight, and more preferably 15 parts by weight.

Initiators corresponding to the respective crosslinking agents may also be included in the composition of the invention. As noted above, when a polyepoxy compound and/or a poly(meth)acrylic compound are used as crosslinking agents, photocuring proceeds even without the use of an initiator, giving a cured film, although it is acceptable to use an initiator in such cases.

When a polyepoxy compound is used as the crosslinking agent, a photoacid generator or a photobase generator may be used as the initiator.

The photoacid generator used may be one that is suitably selected from among known photoacid generators. For example, use may be made of onium salt derivatives such as diazonium salts, sulfonium salts or iodonium salts.

Illustrative examples include aryldiazonium salts such as phenyldiazonium hexafluorophosphate, 4-methoxyphenyldiazonium hexafluoroantimonate and 4-methylphenyldiazonium hexafluorophosphate; diaryliodonium salts such as diphenyliodonium hexafluoroantimonate, di(4-methylphenyl)iodonium hexafluorophosphate and di(4-t-butylphenyl)iodonium hexafluorophosphate; and triarylsulfonium salts such as triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphate, 4,4'-bis(diphenylsulfonio)phenylsulfide bishexafluoroantimonate, 4,4'-bis(diphenylsulfonio)phenylsulfide bishexafluorophosphate, 4,4'-bis[di(β-hydroxyethoxy)phenylsulfonio]phenylsulfide bishexafluoroantimonate, 4,4'-bis[di(β-hydroxyethoxy)phenylsulfonio]phenylsulfide bishexafluorophosphate, 4-[4'-(benzoyl)phenylthio]phenyl-di(4-fluorophenyl)sulfonium hexafluoroantimonate and 4-[4'-(benzoyl)phenylthio]phenyl-di(4-fluorophenyl)sulfonium hexafluorophosphate.

Commercial products may be used as these onium salts. Illustrative examples include San-Aid SI-60, SI-80, SI-100, SI-60L, SI-80L, SI-100L, SI-L145, SI-L150, SI-L160, SI-L110 and SI-L147 (all available from Sanshin Chemical Industry Co., Ltd.); UVI-6950, UVI-6970, UVI-6974, UVI-6990 and UVI-6992 (all available from Union Carbide); CPI-100P, CPI-100A, CPI-200K and CPI-200S (all available from San-Apro Ltd.); Adeka Optomer SP-150, SP-151, SP-170 and SP-171 (all available from Adeka Corporation); Irgacure 261 (BASF); CI-2481, CI-2624, CI-2639 and CI-2064 (Nippon Soda Co., Ltd.); CD-1010, CD-1011 and CD-1012 (Sartomer Company); DS-100, DS-101, DAM-101, DAM-102, DAM-105, DAM-201, DSM-301, NAI-100, NAI-101, NAI-105, NAI-106, SI-100, SI-101, SI-105, SI-106, PI-105, NDI-105, BENZOIN TOSYLATE, MBZ-101, MBZ-301, PYR-100, PYR-200, DNB-101, NB-101, NB-201, BBI-101, BBI-102, BBI-103 and BBI-109 (all from Midori Kagaku Co., Ltd.); PCI-061T, PCI-062T, PCI-020T and PCI-022T (all from Nippon Kayaku Co., Ltd.); and IBPF and IBCF (Sanwa Chemical Co., Ltd.).

The photobase generator used may be one selected from among known photobase generators. For example, use may be made of Co-amine complex-type, oxime carboxylic acid ester-type, carbamic acid ester-type and quaternary ammonium salt-type photobase generators.

Illustrative examples include 2-nitrobenzylcyclohexyl carbamate, triphenylmethanol, O-carbamoylhydroxylamide, O-carbamoyloxime, [[(2,6-dinitrobenzyl)oxy]carbonyl]cyclohexylamine, bis[[(2-nitrobenzyl)oxy]carbonyl]hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate), 2-benzyl-2-dimethylamino-1-(4-morpholinophenyl)butanone, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine.

A commercial product may be used as the photobase generator. Illustrative examples include TPS-OH, NBC-101 and ANC-101 (all available under these product names from Midori Kagaku Co., Ltd.).

In cases where a photoacid or photobase generator is used, the amount thereof is preferably in the range of 0.1 to 15 parts by weight, and more preferably 1 to 10 parts by weight, per 100 parts by weight of the polyepoxy compound.

Also, from 1 to 100 parts by weight of an epoxy resin curing agent may be optionally included per 100 parts by weight of the polyepoxy compound.

In cases where a poly(meth)acrylic compound is used, a photoradical initiator may also be used.

A known photoradical initiator may be suitably selected and used for this purpose. Exemplary photoradical initiators include acetophenones, benzophenones, Michler's benzoyl benzoate, amyloxime esters, oxime esters, tetramethylthiuram monosulfide and thioxanthones.

Photocleavable photoradical initiators are especially preferred. Photocleavable photoradical initiators are listed on page 159 of *Saishin UV Koka Gijutsu* [Recent UV Curing Technology] (publisher, K. Takausu; published by Gijutsu Joho Kyokai KK; 1991).

Examples of commercial photoradical initiators include those available from BASF under the trade names Irgacure 127, 184, 369, 379, 379EG, 651, 500, 754, 819, 903, 907, 784, 2959, CGI1700, CGI1750, CGI1850, CG24-61, OXE01 and OXE02, and the trade names Darocur 1116, 1173 and MBF; that available from BASF under the trade name Lucirin TPO; that available from UCB under the trade name Uvecryl P36; and those available under the trade names Esacure KIP150, KIP65LT, KIP100F, KT37, KT55, KTO46 and KIP75/B from the Fratelli Lamberti Company.

The photoradical initiator is used in the range of preferably 0.1 to 200 parts by weight, and more preferably 1 to 150 parts by weight, per 100 parts by weight of the poly(meth)acrylic compound.

Any of various types of solvents may be added to the inventive composition and used to dissolve the triazine ring-containing polymer.

Illustrative examples of the solvent include water, toluene, p-xylene, o-xylene, m-xylene, ethylbenzene, styrene, ethylene glycol dimethyl ether, propylene glycol monomethyl ether (PGME), ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate (PGMEA), ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclopentanone, cyclohexanone (CHN), ethyl acetate, isopropyl acetate, n-propyl acetate, isobutyl acetate, n-butyl acetate, ethyl lactate, methanol, ethanol, 2-propanol, t-butyl alcohol, allyl alcohol, 1-propanol, 2-methyl-2-butanol, isobutyl alcohol, 1-butanol, 2-methyl-1-butanol, 1-pentanol, 2-methyl-1-pentanol, 2-ethylhexanol, 1-methoxy-2-propanol, THF, 1,4-dioxane, DMF, DMAc, NMP, 1,3-dimethyl-2-imidazolidinone, DMSO and N-cyclohexyl-2-pyrrolidinone. These may be used singly or two or more may be used in combination.

The solids concentration in the composition is not particularly limited, provided it is in a range that does not adversely affect the storage stability, and may be suitably selected according to the target film thickness. Specifically, from the standpoint of solubility and storage stability, the solids concentration is preferably from 0.1 to 50 wt %, and more preferably from 0.1 to 40 wt %.

Ingredients other than the triazine ring-containing polymer, crosslinking agent and solvent may also be included in the inventive composition, provided that doing so does not detract from the advantageous effects of the invention. Examples of such other ingredients include additives such as leveling agents, surfactants, silane coupling agents and inorganic fine particles.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkyl aryl ethers such as polyoxyethylene octyl phenyl ether and polyoxyethylene nonyl phenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08, R-30, R-40, F-553, F-554, RS-75 and RS-72-K (DIC Corporation), Fluorad FC430 and FC431 (Sumitomo 3M, Ltd.), AsahiGuard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly, or two or more may be used in combination. The amount of surfactant used per 100 parts by weight of the triazine ring-containing polymer is preferably from 0.0001 to 5 parts by weight, more preferably from 0.001 to 1 part by weight, and even more preferably from 0.01 to 0.5 part by weight.

Exemplary inorganic fine particles include oxides, sulfides and nitrides of one, two or more metals selected from the group consisting of beryllium, aluminum, silicon, titanium, vanadium, iron, copper, zinc, yttrium, zirconium, niobium, molybdenum, indium, tin, antimony, tantalum, tungsten, lead, bismuth and cerium. Oxides of these metals are especially preferred. The inorganic fine particles may be of a single type used alone, or two or more types may be used in combination.

Illustrative examples of metal oxides include $Al_2O_3$, ZnO, $TiO_2$, $ZrO_2$, $Fe_2O_3$, $Sb_2O_5$, BeO, ZnO, $SnO_2$, CeO, $SiO_2$ and $WO_3$.

It is also effective to use a plurality of metal oxides as a mixed oxide. Mixed oxides refer to two or more inorganic oxides that have been mixed together at the fine particle production stage. Illustrative examples include mixed oxides of $TiO_2$ and $ZrO_2$, mixed oxides of $TiO_2$ and $ZrO_2$ and $SnO_2$, and mixed oxides of $ZrO_2$ and $SnO_2$.

In addition, compounds of the above metals may be used. Examples of such compounds include $ZnSb_2O_6$, $BaTiO_3$, $SrTiO_3$ and $SrSnO_3$. Such compounds may be used singly, two or more may be used in admixture, or such compounds may be used in admixture with the above oxides.

The other ingredients mentioned above may be added in any step during preparation of the inventive composition.

The film-forming composition of the invention may be rendered into the desired cured film by applying the composition onto a substrate, then optionally heating to evaporate off the solvent, followed by heating or light irradiation.

Any suitable method may be used for applying the composition, such as spin coating, dipping, flow coating, inkjet printing, jet dispensing, spraying, bar coating, gravure coating, slit coating, roll coating, transfer printing, brush coating, blade coating and air knife coating.

Illustrative examples of the substrate include substrates made of silicon, indium tin oxide (ITO)-coated glass, indium zinc oxide (IZO)-coated glass, polyethylene terephthalate (PET), plastic, glass, quartz or ceramic. Use can also be made of a flexible substrate having pliability.

The bake temperature for evaporating off the solvent is not particularly limited. The bake may be carried out at, for example, from 110 to 400° C.

The bake process is not particularly limited. For example, evaporation may be effected using a hot plate or an oven, such evaporation being carried out under a suitable atmosphere, such as in open air, in nitrogen or another inert gas, or in a vacuum.

With regard to the bake temperature and time, conditions which are compatible with the processing steps for the target electronic device should be selected. Bake conditions should be selected in such a way that the physical values of the resulting film conform to the required characteristics of the electronic device.

The conditions in cases where light irradiation is carried out are also not particularly limited. For example, an irradiation energy and time which are suitable for the triazine ring-containing polymer and crosslinking agent used may be employed.

In the production of a cured film by irradiating the composition with light, it is also possible to form a fine pattern by light irradiation through a mask, followed by development with a developing solution.

In this case, development following light exposure may be carried out by immersing the light-exposed resin in, for example, an organic solvent-based developing solution or an aqueous developing solution.

Examples of organic solvent-based developing solutions include those prepared with PGME, PGMEA, a mixed solvent of PGME and PGMEA, NMP, γ-butyrolactone, or DMSO. Examples of aqueous developing solutions include alkaline aqueous solutions of, e.g., sodium carbonate, potassium carbonate, sodium hydroxide, potassium hydroxide or tetramethylammonium hydroxide.

For preparation of a negative-working patterning composition, an oxirane ring-containing compound and a photocuring catalyst may additionally be included in the above composition.

The oxirane ring-containing composition is exemplified by those having one or more, and preferably two or more, oxirane rings on the molecule. Illustrative examples include glycidyl ether-type epoxy resins, glycidyl ester-type epoxy resins, alicyclic epoxy resins, epoxy-modified polybutadiene resins and oxetane compounds. These may be used singly, or two or more may be used in combination.

The oxirane ring-containing compound content, although not particularly limited, may be set to from about 10 to about 400 parts by weight per 100 parts by weight of the triazine ring-containing polymer.

Photocuring catalysts are exemplified by photocation generators. Illustrative examples of photocation generators include triarylsulfonium salts such as triphenylsulfonium hexafluorophosphate and triphenylsulfonium hexafluoroantimonate; triarylselenium salts; and diaryliodonium salts such as diphenyliodonium hexafluorophosphate and diphenyliodonium hexafluoroantimonate. These may be used singly, or two or more may be used in combination.

The photocuring catalyst content, although not particularly limited, may be set to from about 0.1 to about 100 parts by weight per 100 parts by weight of the triazine ring-containing polymer.

The method of preparing the negative-working patterning composition is not particularly limited; preparation may be carried out by adding the ingredients in any order. Also, the above-mentioned solvent may be used at this time.

This composition, after being applied onto a substrate by the above-described technique, may be cured by irradiation with, e.g., ultraviolet light at a dose of 1 to 4,000 mJ/cm$^2$. Light irradiation may be carried out using any of various known means such as a high-pressure mercury vapor lamp, metal halide lamp, xenon lamp, LEDs or laser light.

Where necessary, the composition may be heated at about 110 to 180° C. before and after light exposure.

Development following light exposure may be carried out by immersing the exposed resin in the above-described organic solvent-based developing solution or aqueous developing solution.

For preparation as a positive-working patterning composition, an azide compound may additionally be included in the above composition.

The azide compound is preferably a compound having at least one, and more preferably at least two, 1,2-naphthoquinonediazide groups. Illustrative examples include 1,2-naphthoquinonediazidosulfonic acid derivatives such as the ester of 2,3,4-trihydroxybenzophenone and 1,2-naphthquinone-2-diazido-5-sulfonic acid.

The azide compound content, although not particularly limited, may be set to about 4 to 60 parts by weight per 100 parts by weight of the triazine ring-containing polymer.

The method of preparing the positive-working patterning composition is not particularly limited; preparation may be carried out by adding the ingredients in any order. Also, the above-mentioned solvent may be used at this time.

This composition, after being applied onto a substrate by the above-described technique, may be cured by the above-mentioned light-irradiating means involving irradiation with, e.g., ultraviolet light at a dose of 1 to 2,000 mJ/cm$^2$. Here too, where necessary, the composition may be heated at about 110 to 180° C. before and after light exposure.

Development following light exposure may be carried out by immersing the exposed resin in the above-mentioned organic solvent-based developing solution or aqueous developing solution.

Various types of additives may be optionally added to the above patterning compositions. Illustrative examples of additives include thermocation generators such as benzyl-4-hydroxyphenylmethylsulfonium hexafluoroantimonate, 1-naphthylmethyl-4-hydroxyphenylmethylsulfonium hexafluoroantimonate and 4-hydroxyphenyldimethylsulfonium methyl sulfate; photosensitizers such as 2,5-diethyl-thioxanthone, anthracene and 9,10-ethoxyanthracene; and the additives mentioned above in the description of the film-forming composition.

The cured films and fine patterns of the invention obtained in the above manner are able to attain a high heat resistance, high index of refraction and low volume shrinkage, and therefore can be suitably utilized in the fields of electronic devices and optical materials as, for example, components in the fabrication of liquid-crystal displays, organic EL displays, touch panels, LED devices, solid-state image sensors, organic thin-film solar cells, dye-sensitized solar cells, TFTs, lenses, prisms, cameras, binoculars, microscopes, semiconductor steppers and the like.

In particular, because cured films and fine patterns produced from the inventive composition have a high transparency and also have a high index of refraction, the visibility of transparent conductive films made of ITO or silver nanowires can be improved and the deterioration of transparent conductive films can be inhibited.

The transparent conductive film is preferably an ITO film, an IZO film, or a transparent conductive film having electrically conductive nanostructures such as metal nanoparticles, metal nanowires or metal nanomeshes. A transparent conductive film having electrically conductive nanostructures is more preferred. The metal making up the conductive nanostructures is not particularly limited. Examples include silver, gold, copper, nickel, platinum, cobalt, iron, zinc, ruthenium, rhodium, palladium, cadmium, osmium, iridium, and alloys thereof. That is, a transparent conductive film having, for example, silver nanoparticles, silver nanowires, silver nanomeshes, gold nanoparticles, gold nanowires, gold nanomeshes, copper nanoparticles, copper nanowires or copper nanomeshes is preferred. A transparent conductive film having silver nanowires is especially preferred.

Moreover, high refractive index patterns produced from the inventive composition can be advantageously used in applications for which high refractive index patterns are desired, such as to prevent the transparent electrodes in the above touch panels and the like from being visually apparent, organic EL display light extraction applications, and black matrix applications.

EXAMPLES

Working Examples and Comparative Examples are given below to more concretely illustrate the invention, although the invention is not limited by these Examples. The instruments used in the Examples were as follows.

[$^1$H-NMR]
  Instruments: Varian NMR System 400 NB (400 MHz) JEOL-ECA700 (700 MHz)
  Solvent used in measurement: DMSO-d6
  Reference material: Tetramethylsilane (TMS) ($\delta$=0.0 ppm)
[GPC]
  Instrument: SCL-10Avp (Shimadzu Corporation), modified for GPC
  Columns: Shodex KF-804L+KF-805L
  Column temperature: 60° C.
  Solvent: NMP (1% LiCl)
  Detector: UV (254 nm)
  Calibration curve: polystyrene standard
[Ultraviolet/Visible Spectrophotometer]
  Instrument: UV-3600 (Shimadzu Corporation)
[Ellipsometer]
  Instrument: VASE multiple incident angle spectroscopic ellipsometer (JA Woollam Japan)

[Thermogravimetric/Differential Thermal Analyzer (TG-DTA)]
Instrument: TG-8120 (Rigaku Corporation)
Temperature rise rate: 10° C./min
Measurement temperatures: 25° C. to 750° C.
[Electron Microscope]
S-4800 electron microscope, from JEOL Ltd.
[1] Triazine Ring-Containing Polymer Synthesis

[Working Example 1] Synthesis of Polymeric Compound [5]

[Chemical Formula 47]

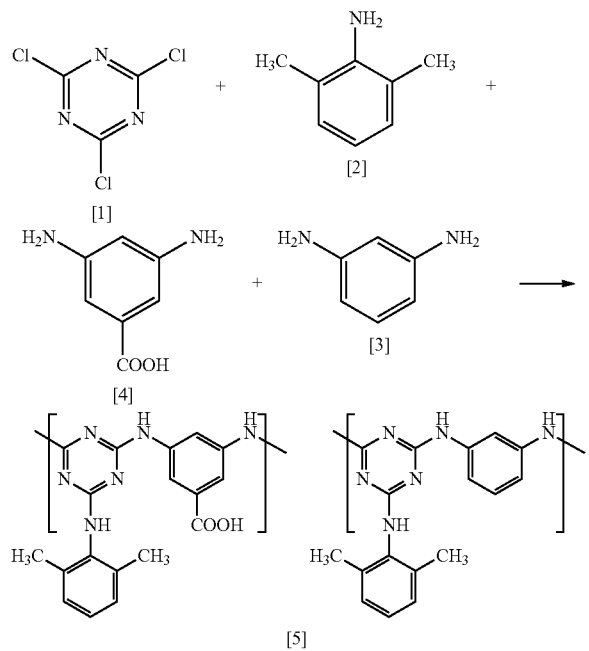

Under nitrogen, 467.12 g of DMAc was added to a 2-liter four-neck flask and 2,4,6-trichloro-1,3,5-triazine (CYC) [1] (105.59 g, 0.57 mol; Evonik Degussa) was dissolved therein at not above 0° C. 2,6-Xylidine [2] (69.11 g, 0.57 mol; BASF) was added dropwise and the reaction was effected for 1 hour while controlling the temperature to not above 0° C. Next, a solution of m-phenylenediamine (mPDA) [3] (30.82 g, 0.285 mol; AminoChem) and 3,5-diaminobenzoic acid [4] (86.73 g, 0.57 mol; Nipponjunryo Chemicals) dissolved in 700.95 g of NMP was added dropwise while controlling the temperature at the interior of the flask to not above 30° C. Following addition, the temperature was raised to 90° C. and the reaction was carried out for 2 hours, after which 104.38 g of n-propylamine was added. One hour later, the temperature was lowered to room temperature, stopping polymerization.

The reaction mixture was added dropwise to 7,104.45 g of deionized water and re-precipitation was carried out. The resulting precipitate was filtered, and the filtered matter was re-dissolved in 543.52 g of THF, then re-precipitated in 8,046.90 g of deionized water. Next, the product obtained by filtration was dried at 100° C. for 8 hours, giving 89.46 g of the target Polymeric Compound [5]. FIG. 1 shows the results obtained from measurement of the $^1$H-NMR spectrum for Polymeric Compound [5]. The resulting Polymeric Compound [5] was a compound having structural units of formula (1). The polystyrene-equivalent Mw measured by GPC was 6,500, and the polydispersity (Mw/Mn) was 1.47.

Upon weighing out 5.87 mg of Polymeric Compound [5] obtained in Working Example 1 on a platinum pan and carrying out measurement by TG-DTA at a temperature rise rate of 15° C./min, the 5% weight loss temperature was 323° C.

[Working Example 2] Synthesis of Acryloyl-Terminated Polymeric Compound [7]

[Chemical Formula 48]

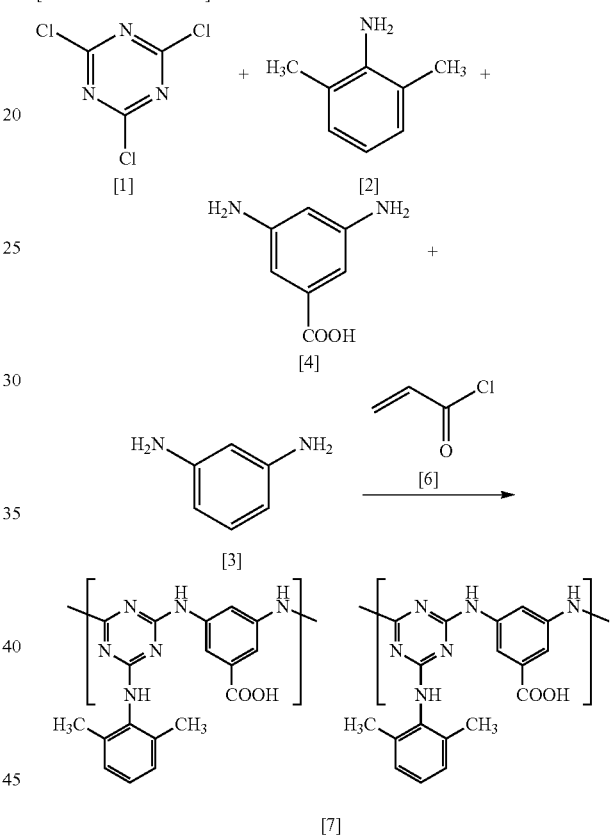

Under nitrogen, 940.15 g of DMAc was added to a 2-liter four-neck flask and (CYC) [1] (184.49 g, 1.0 mol; Evonik Degussa) was dissolved therein at not above 0° C. 2,6-Xylidine [2] (121.27 g, 1.0 mol; BASF) was added dropwise and the reaction was effected for 1 hour while controlling the temperature to not above 0° C. Next, a solution of mPDA [3] (54.07 g, 0.5 mol; AminoChem) and 3,5-diaminobenzoic acid [4] (152.15 g, 1.0 mol; Nipponjunryo Chemicals) dissolved in 1,402.12 g of NMP was added dropwise while controlling the temperature at the interior of the flask to not above 30° C. Following addition, the temperature was raised to 90° C. and the reaction was carried out for 2 hours, then the temperature was lowered to not above 50° C. and acryloyl chloride [6] (72.85 g, 0.8 mol; Tokyo Chemical Industry Co., Ltd.) was added dropwise. Next, triethylamine (384.79 g, 0.8 mol; Tokyo Chemical Industry Co., Ltd.) was added dropwise to the reaction mixture controlled to not above 50° C. and the flask contents were stirred for 1 hour.

Figure 2:
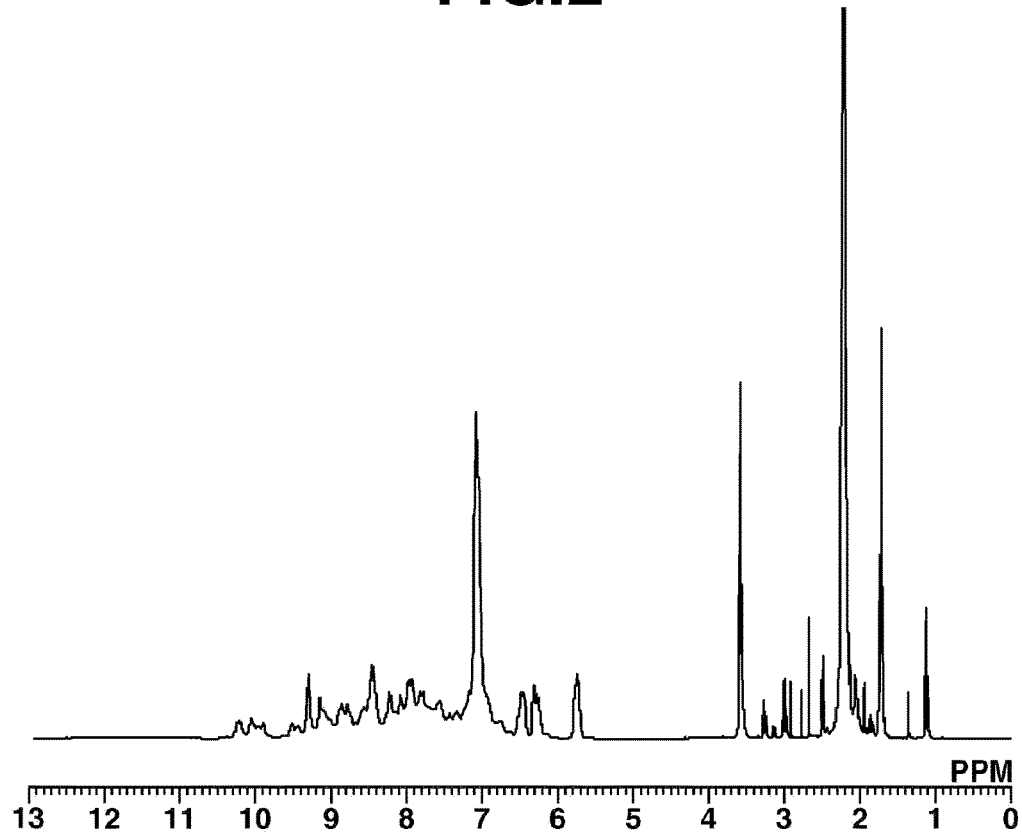
FIG. 2 shows the $^1$H-NMR spectrum for Polymer Compound [7] obtained in Working Example 2.

The resulting slurry-like reaction mixture was added dropwise to 14,098 g of deionized water and re-precipitation was carried out. The resulting precipitate was filtered, and the filtered matter was re-dissolved in 1,752.65 g of THF and stirred for 1 hour, then left at rest to effect liquid separation. The aqueous layer was discarded and 50.45 g of THF was added to the organic layer, which was then re-precipitated in 14,038.23 g of deionized water. Next, the product obtained by filtration was dried at 100° C. for 10 hours, giving 353.5 g of the target Polymeric Compound [7]. FIG. 2 shows the results obtained from measurement of the H-NMR spectrum for Polymeric Compound [7]. The resulting Polymeric Compound [7] was a compound having structural units of formula (1). The polystyrene-equivalent Mw measured by GPC was 6,000, and the Mw/Mn was 1.27.

Polymeric Compound [7] obtained in Working Example 2 was measured by TG-DTA at a temperature rise rate of 15° C./min in the same way as in Working Example 1, whereupon the 5% weight loss temperature was 290° C.

[Working Example 3] Synthesis of Acetyl-Terminated Polymeric Compound [9]

[Chemical Formula 49]

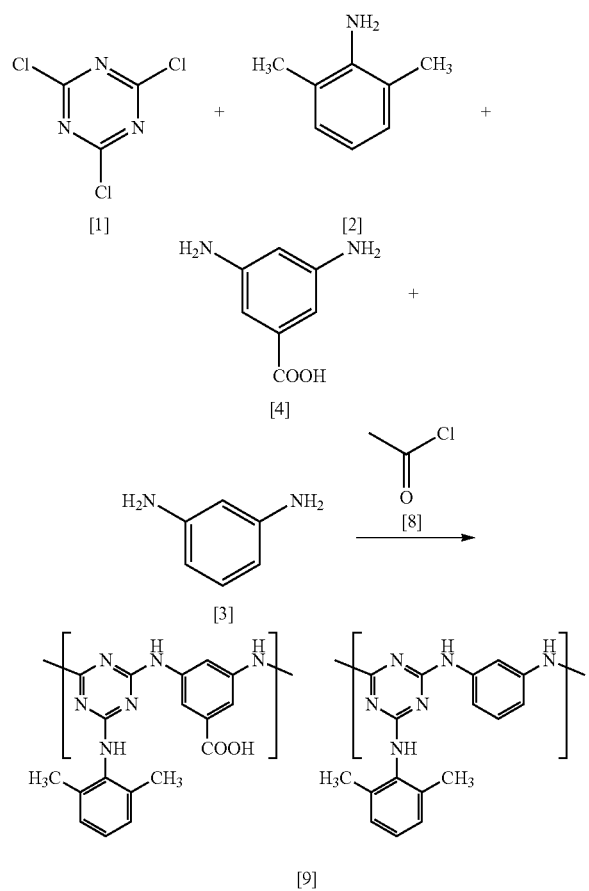

Figure 3:
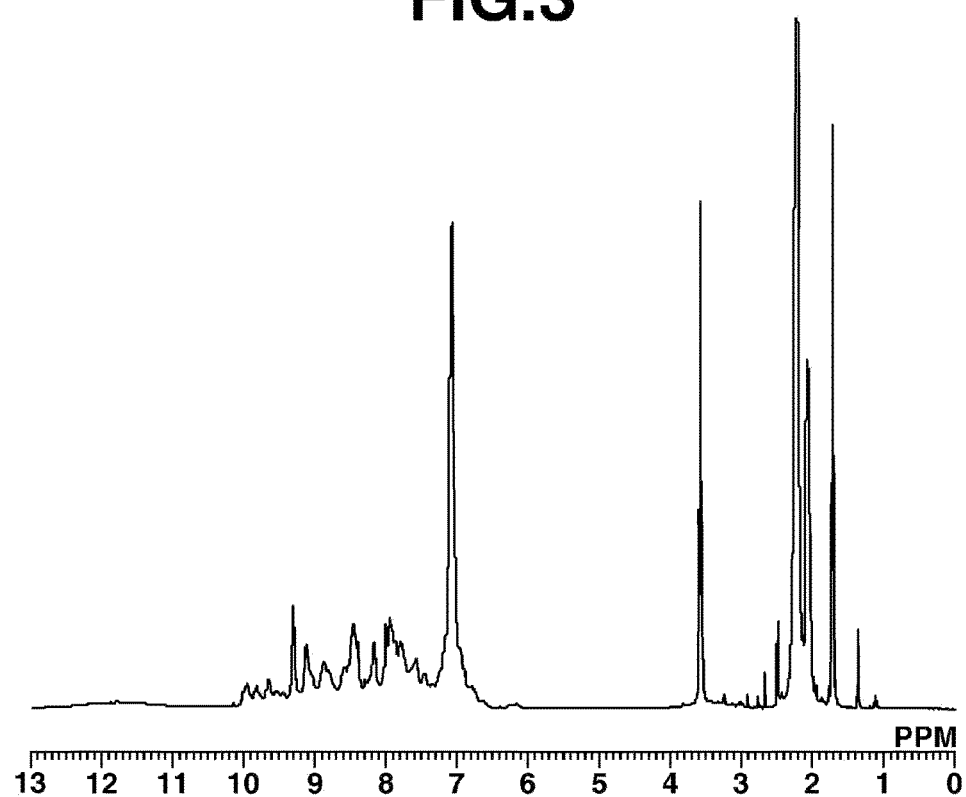
FIG. 3 shows the $^1$H-NMR spectrum for Polymer Compound [9] obtained in Working Example 3.

Aside from changing the acryloyl chloride [6] to acetyl chloride [8] (11.35 g, 0.144 mol; Kanto Chemical Co., Inc.), 64.49 g of the target polymeric compound [9] was obtained in the same way as in Working Example 2. FIG. 3 shows the results obtained from measurement of the $^1$H-NMR spectrum for Polymeric Compound [9]. The resulting polymeric compound [9] was a compound having structural units of formula (1). The polystyrene-equivalent Mw measured by GPC was 3,400, and the Mw/Mn was 1.25.

Polymeric Compound [9] obtained in Working Example 3 was measured by TG-DTA at a temperature rise rate of 15° C./min in the same way as in Working Example 1, whereupon the 5% weight loss temperature was 300° C.

[Working Example 4] Synthesis of Polymeric Compound [11]

[Chemical Formula 50]

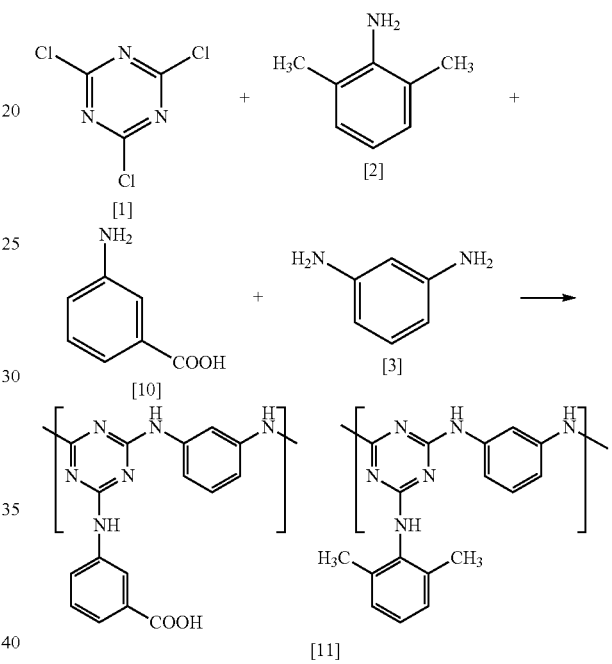

Under nitrogen, 2,6-xylidine [2] (1.82 g, 0.015 mol; BASF) and 3-aminobenzoic acid [10] (4.81 g, 0.035 g; Nipponjunryo Chemicals) were added to a 300 mL four-neck flask and dissolved in 57.53 g of NMP, and the temperature was lowered to not above 0° C. Next, CYC [1] (9.23 g, 0.05 mol; Evonik Degussa) was added and the flask contents were stirred for 1 hour, following which mPDA [3] (8.11 g, 0.075 mol; AminoChem) dissolved in 38.52 g of NMP was added dropwise while controlling the temperature at the interior of the flask to not more than 30° C. Following such addition, the temperature was raised to 90° C. and the reaction was carried out for 2 hours, after which 9.19 g of n-propylamine was added and the temperature was lowered to room temperature, stopping polymerization.

Figure 4:
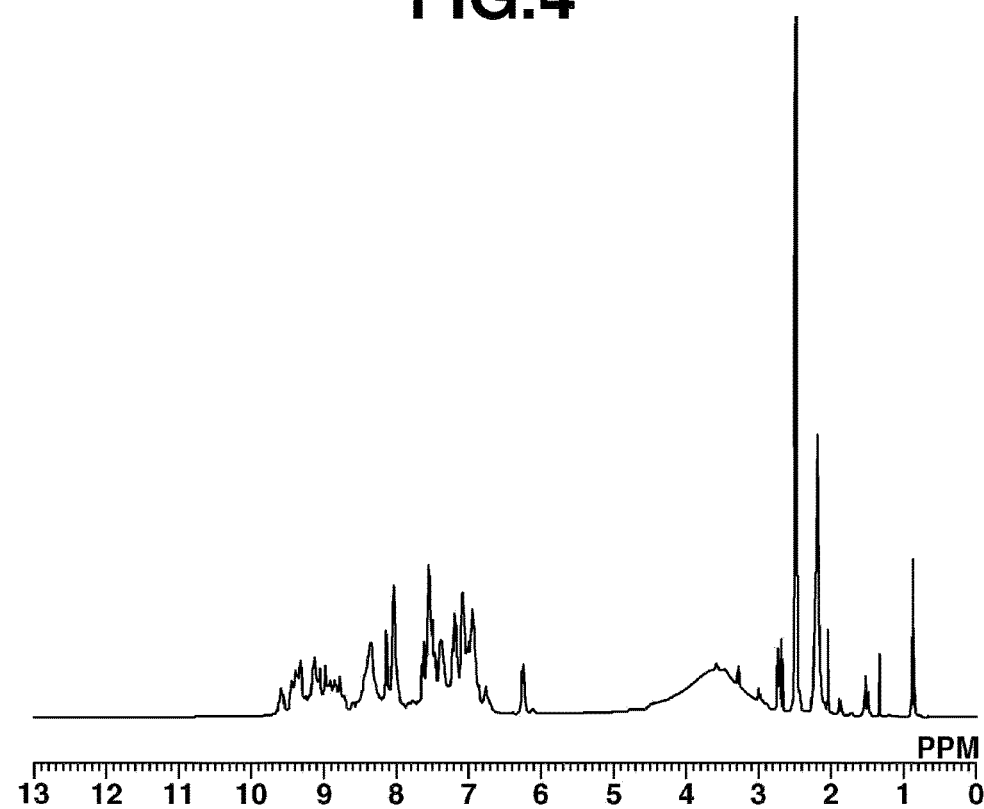
FIG. 4 shows the $^1$H-NMR spectrum for Polymer Compound [11] obtained in Working Example 4.

The reaction mixture was added dropwise to 574.91 g of deionized water and re-precipitation was carried out. The resulting precipitate was filtered, and the filtered matter was re-dissolved in 95.78 g of THF, then re-precipitated in 575.30 g of deionized water. Next, the product obtained by filtration was dried at 100° C. for 8 hours, giving 9.78 g of the target Polymeric Compound [11] (referred to below as "L-TMX72"). FIG. 4 shows the results obtained from measurement of the $^1$H-NMR spectrum for L-TMX72. The L-TMX72 obtained was a compound having structural units of formula (1). L-TMX72 had a polystyrene-equivalent Mw as measured by GPC of 6,500, and the Mw/Mn was 1.47.

[Comparative Example 1] Synthesis of Polymeric Compound [14]

(1) Synthesis of 2-Anilino-4,6-Dichloro-1,3,5-Triazine [13]

[Chemical Formula 51]

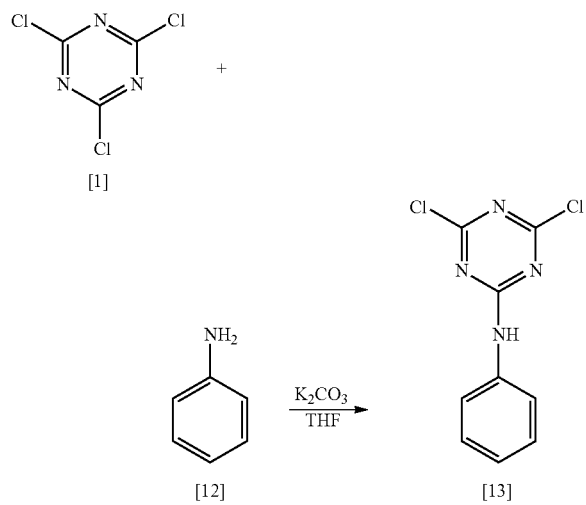

A 500 mL four-neck flask was charged with CYC [1] (25.0 g, 138 mmol; Tokyo Chemical Industry Co., Ltd.) dissolved in 190 mL of THF, and the interior of the system was flushed with nitrogen. This was cooled to 0° C. and aniline [12] (12.8 g, 138 mmol; Junsei Chemical Co., Ltd.) dissolved in 190 mL of THF was added dropwise over 30 minutes under stirring, following which stirring was continued for 2 hours. The reaction mixture was transferred to a separatory funnel, a solution of potassium carbonate (19.04 g, 138 mmol) dissolved in 171 mL of deionized water was added, and the THF layer was washed. The aqueous layer was discarded, following which the THF was driven off under reduced pressure and the resulting solid was washed with deionized water, giving 27.8 g of the target 2-anilino-4,6-dichloro-1,3,5-triazine [13].

(2) Synthesis of Polymeric Compound [14]

[Chemical Formula 52]

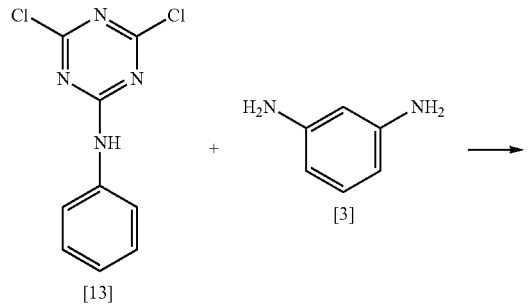

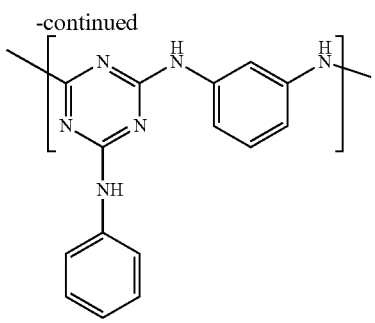

Under nitrogen, mPDA [3] (1.35 g, 12.44 mmol; Tokyo Chemical Industry Co., Ltd.) was placed in a 100 mL four-neck flask, dissolved in 17 mL of DMAc, and heated on an oil bath to 100° C. Next, 2-anilino-4,6-dichloro-1,3,5-triazine [13] (3.00 g, 12.44 mmol) dissolved in 26 mL of DMAc was added and polymerization was begun. The reaction was carried out for 2 hours and the system was allowed to cool to room temperature, after which the reaction mixture was re-precipitated in a mixed solution obtained by dissolving a 28% aqueous solution of ammonia (2.27 g) in 160 mL of water and 54 mL of methanol. The precipitate was filtered, re-dissolved in 35 mL of DMF and re-precipitated in 170 mL of deionized water. The resulting precipitate was filtered, and then dried in a vacuum desiccator at 120° C. for 6 hours, giving 2.25 g of the target Polymeric Compound [14]. Polymeric Compound [14] had a polystyrene-equivalent Mw as measured by GPC of 3,100, and the Mw/Mn was 1.60.

Polymeric Compound [14] obtained in Comparative Example 1 was measured by TG-DTA at a temperature rise rate of 15° C./min in the same way as in Working Example 1, whereupon the 5% weight loss temperature was 340° C.

The solutions obtained when the polymeric compounds synthesized in Working Examples 1 to 3 and Comparative Example 1 were dissolved in THF, CHN and PGME to concentrations of 10 wt %, 20 wt % and 30 wt %, and when the respective powders were dissolved in a large amount of a 1% aqueous solution of $Na_2CO_3$, were visually checked for the presence of insoluble matter and evaluated according to the following criteria. The results are shown in Table 1. As for the polymeric compound obtained in Working Example 4, when the powder was dissolved in a 1% aqueous solution of $Na_2CO_3$ in the same way as described above, insoluble matter was not confirmed.

Good: No insoluble matter
Fair: Slight, scattered amount of insoluble matter
NG: Sediment is present

TABLE 1

|  |  | Working Example 1 | Working Example 2 | Working Example 3 | Comparative Example 1 |
|---|---|---|---|---|---|
| THF | 10 wt % | good | good | good | NG |
|  | 20 wt % | good | good | good | NG |
|  | 30 wt % | good | good | good | NG |
| CHN | 10 wt % | good | good | good | NG |
|  | 20 wt % | good | good | good | NG |
|  | 30 wt % | fair | good | good | NG |
| PGME | 10 wt % | good | good | good | NG |
|  | 20 wt % | fair | good | good | NG |
|  | 30 wt % | NG | good | good | NG |
| 1% $Na_2CO_3$, aqueous |  | good | good | good | NG |

As shown in Table 1, with regard to the polymeric compounds obtained in Working Examples 1 to 3, because polymeric compounds having substituted aryl groups on side chains and having also carboxyl group-bearing arylene groups on the main chain are used, compared with the polymeric compound obtained in Comparative Example 1, they have excellent solubilities in various organic solvents and also in weakly alkaline aqueous solutions.

The increase of solubility in organic solvents is presumably due to relaxation of the strong hydrogen bonds on the polymeric compound by the aromatic amine compound having substituents on side chains.

[2] Film Production

Working Examples 5 to 7

Films were obtained by dissolving the respective polymeric compounds synthesized in Working Examples 1 to 3 in PGME to a concentration of 10 wt %, spin-coating the resulting solution onto a glass substrate with a spin coater, and carrying out a 3-minute bake on a 120° C. hot plate.

Comparative Example 2

CHN/deionized water (96/4, w/w) was added such as to set the concentration of the polymeric compound obtained in Comparative Example 1 to 10 wt %, and precipitate was removed by filtration with a filter. The resulting solution was spin-coated onto a glass substrate using a spin coater, then pre-baked for 2 minutes on a 150° C. hot plate and subsequently subjected to a 5-minute main bake on a 250° C. hot plate, thereby giving a film.

The refractive indices and film thicknesses of the films produced in Working Examples 5 to 7 and in Comparative Example 2 are shown in Table 2.

TABLE 2

|  | Working Example 5 | Working Example 6 | Working Example 7 | Comparative Example 2 |
| --- | --- | --- | --- | --- |
| Refractive index (at 550 nm) | 1.734 | 1.719 | 1.721 | 1.757 |
| Film thickness (nm) | 447 | 352 | 278 | 260 |

As shown in Table 2, the thin films produced from the polymeric compounds synthesized in Working Examples 1 to 3 had refractive indices higher than 1.70.

[3] Preparation of Crosslinking Agent-Containing Composition, and Patterning and Cured Film Production Working Example 8

A patterning composition having a solids content of 20 wt % was prepared in an amount of 6.36 g by adding the following to 0.6 g of Polymeric Compound [7] obtained in Working Example 2: 0.3 g of the polyacrylate DN-0075 (Nippon Kayaku Co., Ltd.), 0.3 g of the polyacrylate A-GLY-20E (Shin-Nakamura Chemical Co., Ltd.), 0.06 g of the photoradical initiator Irgacure OXE01 (BASF), and 5.04 g of PGME.

This composition was filtered with a 0.45 μm filter and coated onto a glass substrate using a spin coater, following which it was baked on a hot plate at 120° C. for 60 seconds, thereby forming a film. The film was irradiated through a photomask with ultraviolet light in a dose at 365 nm of 100 mJ/cm² using a UV aligner (MA6, from Karl Suss). Next, the film was developed by 60 seconds of immersion in a 0.04 wt % aqueous solution of potassium hydroxide at 23° C., and then rinsed with ultrapure running water. Following development, a striped pattern with line/space dimensions of 60 μm/500 μm resolved without residues. Visual examination under a sodium lamp was carried out, whereupon foreign matter was not observed in the cured film that formed on the glass substrate. In addition, on carrying out electron microscopic examination, foreign matter was not observed on the cured film.

Working Example 9

A patterning composition having a solids content of 20 wt % was prepared in an amount of 6.36 g by adding the following to 0.6 g of Polymeric Compound [7] obtained in Working Example 2: 0.3 g of the polyacrylate DN-0075 (Nippon Kayaku Co., Ltd.), 0.3 g of the polyacrylate A-GLY-20E (Shin-Nakamura Chemical Co., Ltd.), 0.06 g of the photoradical initiator Irgacure OXE01 (BASF), and 5.04 g of PGME.

This composition was filtered with a 0.45 μm filter and coated onto a glass substrate using a spin coater, following which it was baked on a hot plate at 120° C. for 60 seconds, thereby forming a film. The film was irradiated over the entire surface with ultraviolet light in a dose at 365 nm of 100 mJ/cm² using a UV aligner (MA6, from Karl Suss).

The refractive index at 550 nm and the film thickness of the resulting cured film were measured with an ellipsometer, whereupon the refractive index was 1.608 (at 550 nm) and the film thickness was 1,440 nm. In addition, the transmittance at 400 nm was measured and found to be 90%.

Working Example 10

A patterning composition having a solids content of 10 wt % was prepared in an amount of 13.023 g by adding the following to 0.6 g of Polymeric Compound [7] obtained in Working Example 2: 0.15 g of the polyacrylate DN-0075 (Nippon Kayaku Co., Ltd.), 0.45 g of the polyacrylate AT-20E (Shin-Nakamura Chemical Co., Ltd.), 0.12 g of the photoradical initiator Irgacure OXE01 (BASF), 0.0003 g of the leveling agent F-477 (DIC Corporation), and 11.8827 g of PGME.

This composition was filtered with a 0.45 μm filter and spin-coated onto a glass substrate at 200 rpm for 5 seconds and at 800 rpm for 30 seconds using a spin coater, following which it was baked on a hot plate at 120° C. for 2 minutes, thereby forming a film. The film was irradiated through a photomask with ultraviolet light in a dose at 365 nm of 100 mJ/cm² using a UV aligner (MA6, from Karl Suss). Next, the film was developed by 60 seconds of immersion in a 0.04 wt % aqueous solution of potassium hydroxide at 23° C., and then rinsed with ultrapure running water. Following development, a striped pattern with line/space dimensions of 20 μm/500 μm resolved without residues. Visual examination under a sodium lamp was carried out, whereupon foreign matter was not observed in the cured film that formed on the glass substrate. In addition, on carrying out electron microscopic examination, foreign matter was not observed on the cured film.

Working Example 11

A patterning composition having a solids content of 10 wt % was prepared in an amount of 13.203 g by adding the following to 0.6 g of Polymeric Compound [7] obtained in Working Example 2: 0.15 g of the polyacrylate DN-0075 (Nippon Kayaku Co., Ltd.), 0.45 g of the polyacrylate AT-20E (Shin-Nakamura Chemical Co., Ltd.), 0.12 g of the photoradical initiator Irgacure OXE01 (BASF), 0.0003 g of the leveling agent F-477 (DIC Corporation), and 11.8827 g of PGME.

This composition was filtered with a 0.45 μm filter and spin-coated onto a glass substrate at 200 rpm for 5 seconds and at 800 rpm for 30 seconds using a spin coater, following which it was baked on a hot plate at 120° C. for 2 minutes seconds, thereby forming a film. The film was irradiated over the entire surface with ultraviolet light in a dose at 365 nm of 100 mJ/cm$^2$ using a UV aligner (MA6, from Karl Suss). The refractive index at 550 nm and the film thickness of the resulting cured film were measured with an ellipsometer, whereupon the refractive index was 1.604 (at 550 nm) and the film thickness was 513 nm. In addition, the transmittance at 400 nm was measured and found to be at least 90%.

Working Example 12

A patterning composition having a solids content of 20 wt % was prepared in an amount of 7.62 g by adding the following to 0.6 g of Polymeric Compound [7] obtained in Working Example 2: 0.15 g of the polyacrylate DN-0075 (Nippon Kayaku Co., Ltd.), 0.45 g of the polyacrylate AT-20E (Shin-Nakamura Chemical Co., Ltd.), 0.12 g of the photoradical initiator Irgacure OXE01 (BASF), 0.257 g of the blocked polyisocyanate TRIXENE BI-7982 (Baxenden), 0.024 g of the leveling agent BYK-333 (BYK-Chemie Japan KK), and 6.019 g of PGME.

This composition was filtered with a 0.45 μm filter and spin-coated onto a glass substrate at 200 rpm for 5 seconds and at 1,200 rpm for 30 seconds using a spin coater, following which it was baked on a hot plate at 60° C. for 5 minutes, thereby forming a film. The film was irradiated through a photomask with ultraviolet light in a dose at 365 nm of 100 mJ/cm$^2$ using a UV aligner (MA6, from Karl Suss). Next, the film was developed by 60 seconds of immersion in a 0.04 wt % aqueous solution of potassium hydroxide at 23° C., and then rinsed with ultrapure running water. Finally, a 10-minute post-bake at 120° C. was carried out on a hot plate. Following development, a striped pattern with line/space dimensions of 20 μm/500 μm resolved without residues. Visual examination under a sodium lamp was carried out, whereupon foreign matter was not observed in the cured film that formed on the glass substrate. In addition, on carrying out electron microscopic examination, foreign matter was not observed on the cured film.

Working Example 13

A patterning composition having a solids content of 20 wt % was prepared in an amount of 7.62 g by adding the following to 0.6 g of Polymeric Compound [7] obtained in Working Example 2: 0.15 g of the polyacrylate DN-0075 (Nippon Kayaku Co., Ltd.), 0.45 g of the polyacrylate AT-20E (Shin-Nakamura Chemical Co., Ltd.), 0.12 g of the photoradical initiator Irgacure OXE01 (BASF), 0.257 g of the blocked polyisocyanate TRIXENE BI-7982 (Baxenden), 0.024 g of the leveling agent BYK-333 (BYK-Chemie Japan KK), and 6.019 g of PGME.

This composition was filtered with a 0.45 μm filter and spin-coated onto a glass substrate for 5 seconds at 200 rpm and for 30 seconds at 1,200 rpm using a spin coater, following which it was baked on a hot plate at 60° C. for 5 minutes, thereby forming a film. The film was irradiated over the entire surface with ultraviolet light in a dose at 365 nm of 100 mJ/cm$^2$ using a UV aligner (MA6, from Karl Suss). Finally, a 10-minute post-bake at 120° C. was carried out on a hot plate. The refractive index at 550 nm and the film thickness of the resulting cured film were measured with an ellipsometer, whereupon the refractive index was 1.610 (at 550 nm) and the film thickness was 1,020 nm. In addition, the transmittance at 400 nm was measured and found to be 95%.

[4] Triazine Ring-Containing Polymer Synthesis 2

[Working Example 14] Synthesis of Acryloyl-Terminated Polymer Compound [16]

[Chemical Formula 53]

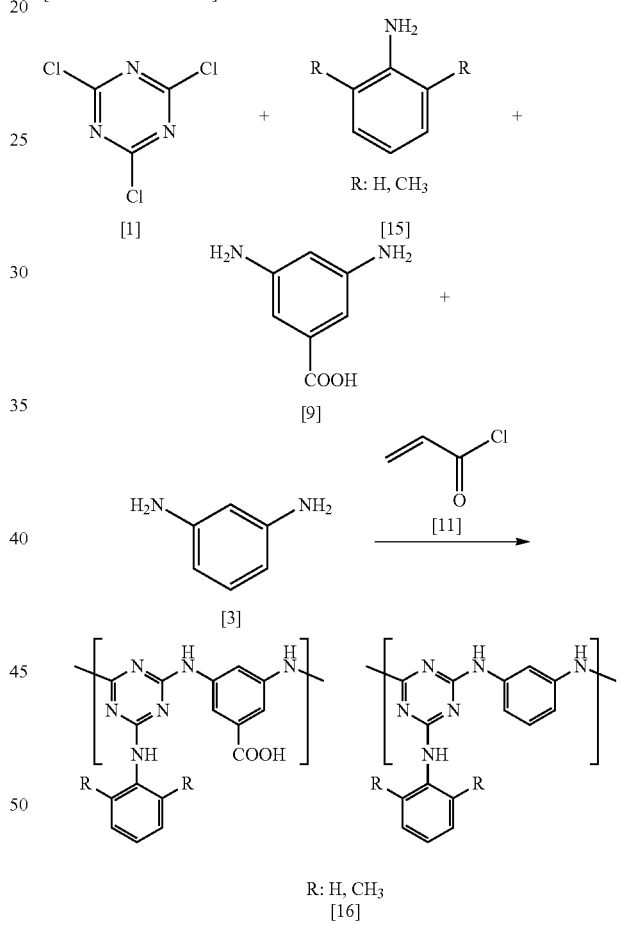

Figure 5:
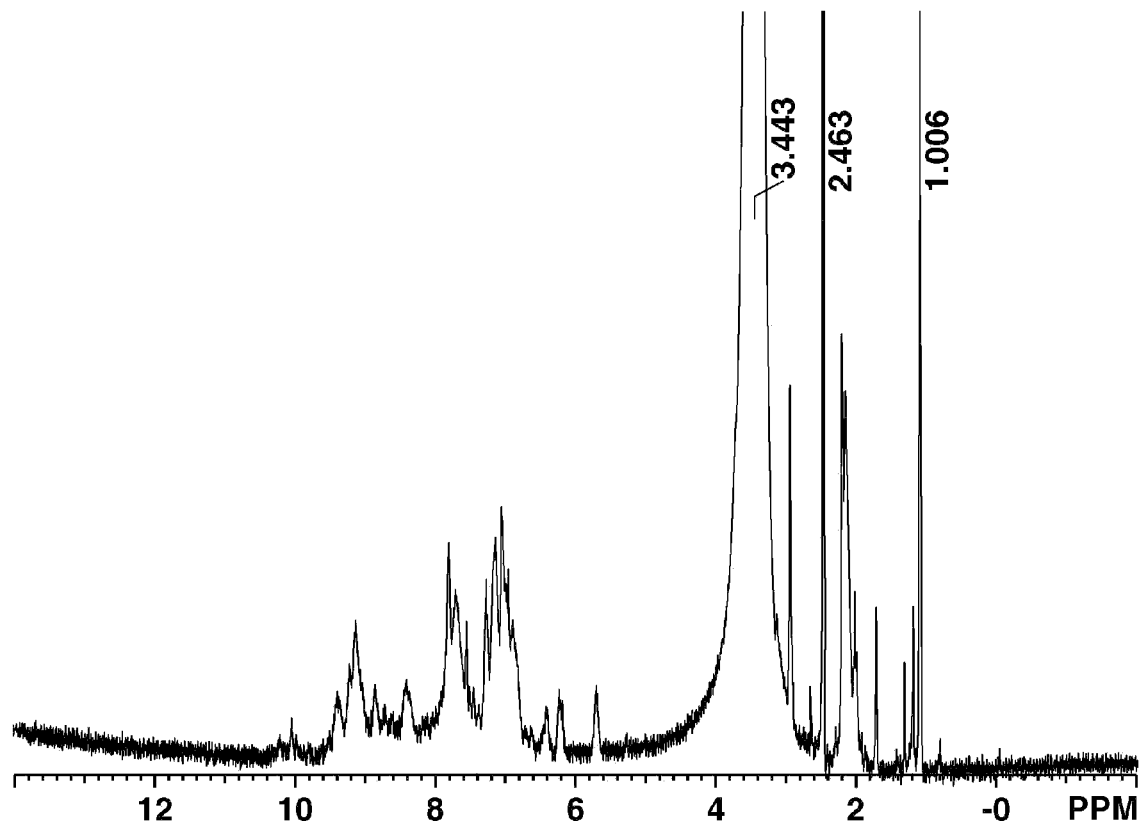
FIG. 5 shows the $^1$H-NMR spectrum for Polymer Compound [16] obtained in Working Example 14.

Aside from using a monomer mixture of 2,6-xylidine (3.64 g, 0.03 mol; BASF) and aniline (1.86 g, 0.02 mol; Junsei Chemical Co., Ltd.) instead of 2,6-xylidine, 6.94 g of Polymer Compound [16] (referred to below as "L-TAX15A") was obtained by carrying out the reaction under the same molar ratio and reaction conditions as in Working Example 2. FIG. 5 shows the results obtained from measurement of the $^1$H-NMR spectrum for L-TAX15A. The resulting Polymeric Compound [16] had a polystyrene-equivalent Mw as measured by GPC of 5,700, and the Mw/Mn was 1.45.

[Working Example 15] Synthesis of Acryloyl-Terminated Polymer Compound [17]

[Chemical Formula 54]

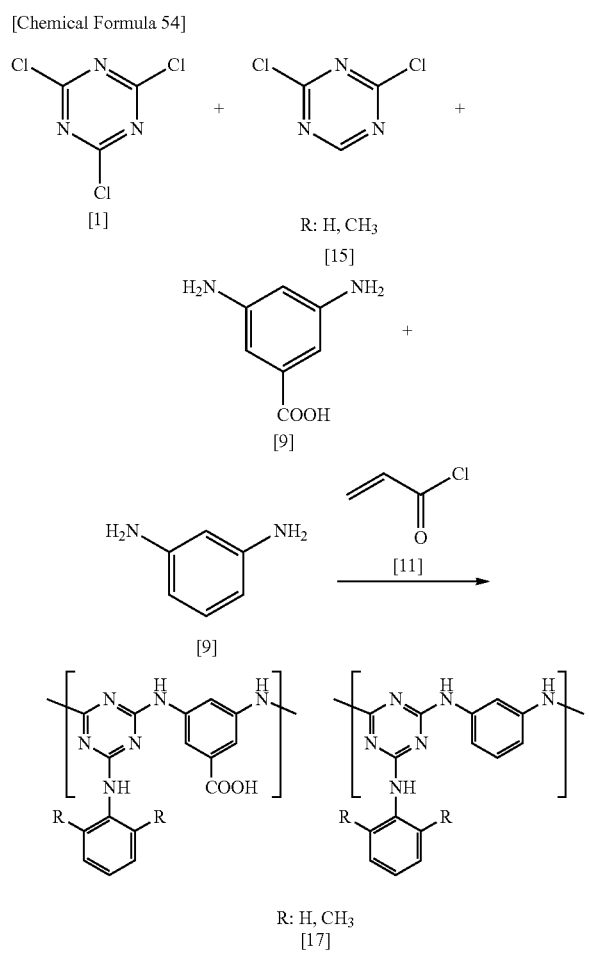

Aside from using a monomer mixture of 2,6-xylidine (3.88 g, 0.032 mol; BASF) and aniline (4.47 g, 0.048 mol; Junsei Chemical Co., Ltd.) instead of 2,6-xylidine, 14.48 g of the target Polymer Compound [17] (referred to below as "L-TAX18A") was obtained in the same way as in Working Example 2 using a monomer mixture of 3,5-diaminobenzoic acid (9.74 g, 0.064 mol; Nipponjunryo Chemicals) and m-phenylenediamine (3.46 g, 0.032 mol; Aminochem). The resulting L-TAX18A had a polystyrene-equivalent Mw as measured by GPC of 1,500, and the Mw/Mn was 1.78.

The solutions obtained when the polymeric compounds synthesized in Working Examples 14 and 15 were dissolved in THF, CHN and PGME to concentrations of 10 wt %, 20 wt % and 30 wt %, and when the respective powders were dissolved in a large amount of a 1% aqueous solution of $Na_2CO_3$ were visually checked for the presence of insoluble matter and evaluated according to the following criteria. The results are shown in Table 3.

Good: No insoluble matter

Fair: Slight, scattered amount of insoluble matter

NG: Sediment is present

TABLE 3

| | | Working Example 4 | Working Example 15 |
|---|---|---|---|
| THF | 10 wt % | good | good |
| | 20 wt % | good | good |
| | 30 wt % | good | good |
| CHN | 10 wt % | good | good |
| | 20 wt % | good | good |
| | 30 wt % | good | good |
| PGME | 10 wt % | good | good |
| | 20 wt % | good | good |
| | 30 wt % | good | good |
| 1% $Na_2CO_3$, aqueous | | good | good |

As shown in Table 3, with regard to the polymeric compounds obtained in Working Examples 14 and 15, because polymeric compounds having substituted aryl groups on side chains and having also carboxyl group-bearing arylene groups on the main chain are used, they have excellent solubilities in various organic solvents and also in weakly alkaline aqueous solutions.

[5] Film Production 2

Working Examples 16 and 17

Films were obtained by dissolving the respective polymeric compounds synthesized in Working Examples 14 and 15 in PGME to a concentration of 10 wt %, spin-coating the resulting solution onto a glass substrate with a spin coater, and carrying out a 3-minute bake on a 120° C. hot plate.

The refractive indices and film thicknesses of the films produced in Working Examples 16 and 17 are shown in Table 4.

TABLE 4

| | Working Example 16 | Working Example 17 |
|---|---|---|
| Refractive index (at 550 nm) | 1.743 | 1.737 |
| Film thickness (nm) | 377 | 254 |

As shown in Table 4, the thin films produced from the polymeric compounds synthesized in Working Examples 14 and 15 had refractive indices higher than 1.73.

The invention claimed is:

1. A triazine ring-containing polymer consisting of a recurring unit structure of formula (1) below, and at least one selected from recurring unit structure of formula (1') and recurring unit structure of formula (1") below:

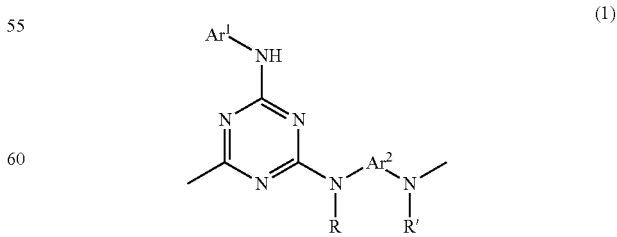

(1)

wherein R and R' each independently represent a hydrogen atom, an alkyl group, an alkoxy group, an aryl group or an aralkyl group;

Ar¹ represents an aryl group which may be substituted with an alkyl, alkoxy, aryl, aralkyl or carboxyl group; and Ar² represents at least one moiety selected from the group consisting of moieties of formulas (2) to (13):

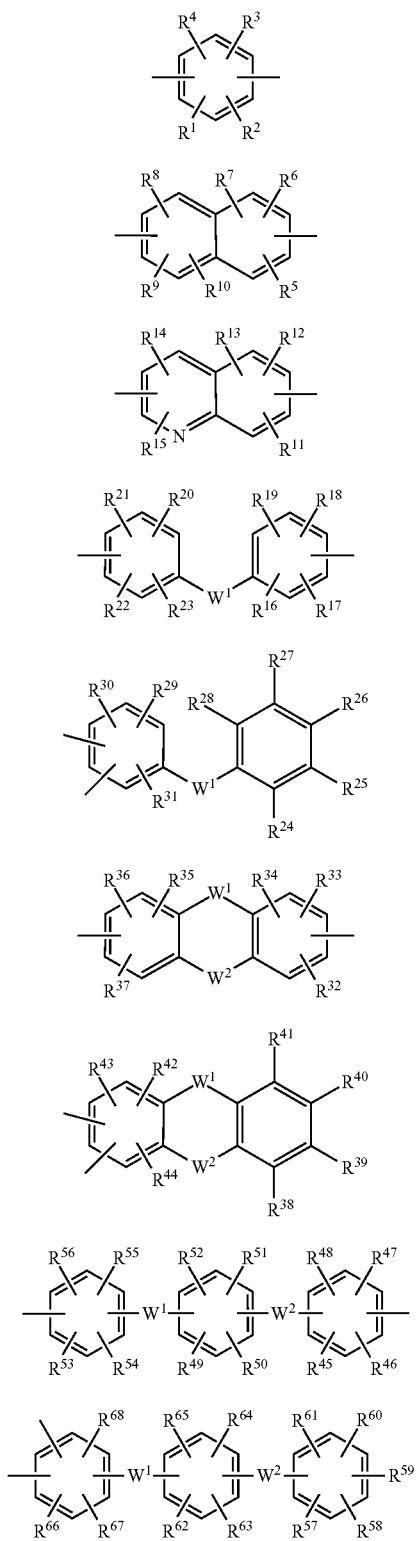

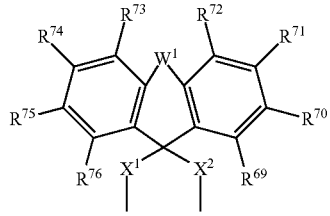

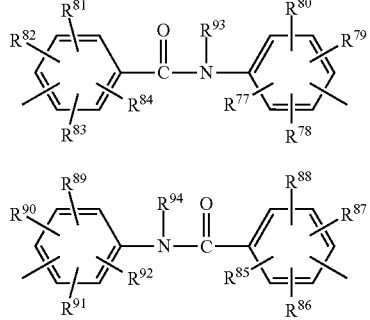

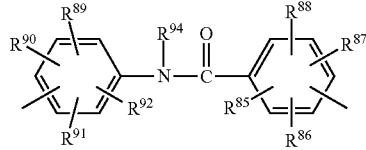

wherein $R^1$ to $R^{92}$ each independently represent a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure;

$R^{93}$ and $R^{94}$ each represent a hydrogen atom or an alkyl group of 1 to 10 carbon atoms which may have a branched structure;

$W^1$ and $W^2$ each independently represent a single bond, $CR^{95}R^{96}$, C=O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure; and $X^1$ and $X^2$ each independently represent a single bond, an alkylene group of 1 to 10 carbon atoms which may have a branched structure, or a group of formula (14):

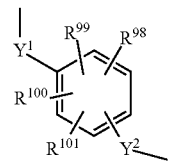

wherein $R^{98}$ to $R^{101}$ each independently representing a hydrogen atom, a halogen atom, a carboxyl group, a sulfo group, an alkyl group of 1 to 10 carbon atoms which may have a branched structure, or an alkoxy group of 1 to 10 carbon atoms which may have a branched structure; and $Y^1$ and $Y^2$ each independently representing a single bond or an alkylene group of 1 to 10 carbon atoms which may have a branched structure);

with the proviso that the recurring unit structure of formula (1) has, on either or both of Ar¹ and Ar², at least one carboxyl group on an aromatic ring,

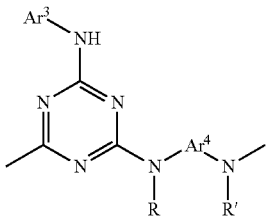
(1')

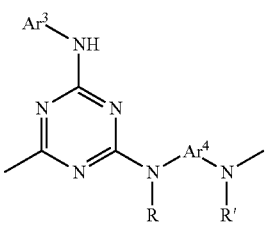
(1")

wherein R and R' each independently represent a hydrogen atom, an alkyl group, an alkoxy group, an aryl group or an aralkyl group;

Ar³ represents an aryl group substituted with an alkyl, alkoxy, aryl or aralkyl group;

Ar⁵ represents an unsubstituted aryl group; and

Ar⁴ represents at least one moiety selected from the group consisting of moieties of formulas (2') to (13'):

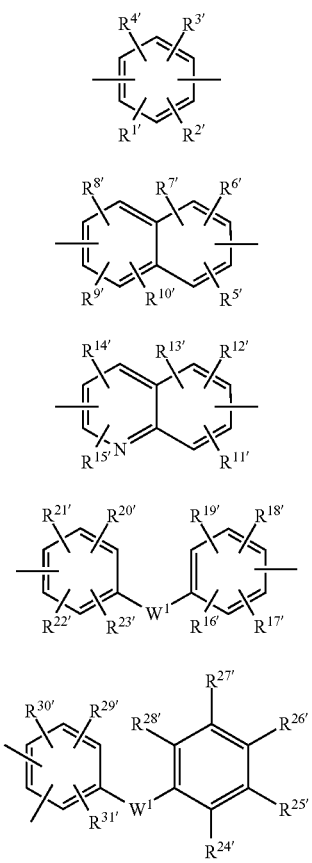

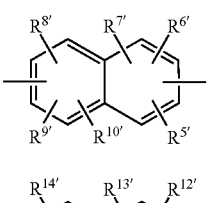

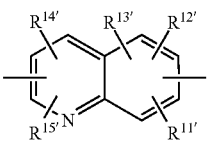

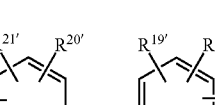

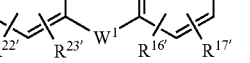

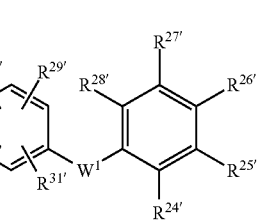

wherein $R^{1'}$ to $R^{92'}$ each independently represent a hydrogen atom, a halogen atom, a sulfo group, an alkyl group of 1 to 10 carbon atoms which may have a branched structure, or an alkoxy group of 1 to 10 carbon atoms which may have a branched structure;

$R^{93}$ and $R^{94}$ each represent a hydrogen atom or an alkyl group of 1 to 10 carbon atoms which may have a branched structure;

$W^1$ and $W^2$ each independently represent a single bond, $CR^{95}R^{96}$, C=O, O, S, CO, $SO_2$, or $NR^{97}$ wherein $R^{95}$ and $R^{96}$ each independently represent a hydrogen atom or an alkyl group of 1 to 10 carbon atoms which may have a branched structure, and $R^{95}$ and $R^{96}$ may together form a ring, and $R^{97}$ represents a hydrogen atom or an alkyl group of 1 to 10 carbon atoms which may have a branched structure; and $X^{1'}$ and $X^{2'}$ each independently represent a single bond, an alkylene group of 1 to 10 carbon atoms which may have a branched structure, or a group of formula (14'):

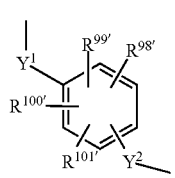
(14')

wherein $R^{98'}$ to $R^{101'}$ each independently representing a hydrogen atom, a halogen atom, a sulfo group, an alkyl group of 1 to 10 carbon atoms which may have a branched structure, or an alkoxy group of 1 to 10 carbon atoms which may have a branched structure; and $Y^1$ and $Y^2$ each independently representing a single bond or an alkylene group of 1 to 10 carbon atoms which may have a branched structure.

2. The triazine ring-containing polymer of claim 1, wherein $Ar^1$ is an aryl group substituted with a carboxyl group.

3. The triazine ring-containing polymer of claim 1, wherein the moieties of formulas (2) to (13) all have therein at least one carboxyl group on at least one aromatic ring.

4. The triazine ring-containing polymer of claim 3, wherein $Ar^1$ is an aryl group substituted with an alkyl, alkoxy, aryl or aralkyl group.

5. The triazine ring-containing polymer of claim 1, wherein $Ar^1$ and $Ar^3$ are aryl groups having an alkyl group of 1 to 20 carbon atoms on at least one ortho position with respect to the NH group on $Ar^1$ and $Ar^3$.

6. The triazine ring-containing polymer of claim 5, wherein $Ar^1$ and $Ar^3$ are phenyl groups having an alkyl group of 1 to 5 carbon atoms at both ortho positions.

7. The triazine ring-containing polymer of claim 6, wherein $Ar^1$ has formula (15):

[Chemical Formula 7]

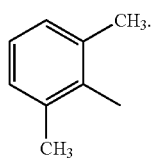
(15)

8. The triazine ring-containing polymer of claim 1, wherein $Ar^2$ has formula (16):

[Chemical Formula 8]

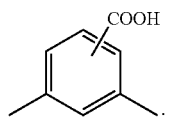
(16)

9. The triazine ring-containing polymer of claim 8, wherein $Ar^2$ has formula (17):

[Chemical Formula 9]

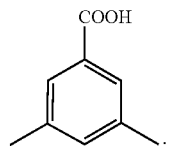
(17)

10. The triazine ring-containing polymer of claim 1, wherein $Ar^4$ has formula (18):

[Chemical Formula10]

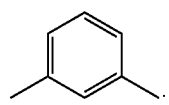
(18)

11. The triazine ring-containing polymer of claim 1 which has at least one diamine end, wherein at least one such diamine end is capped with an acyl group, an alkoxycarbonyl group, an aralkyloxycarbonyl group or an aryloxycarbonyl group.

12. A triazine polymer-containing composition comprising the triazine ring-containing polymer of claim 1 and an organic solvent.

13. The triazine polymer-containing composition of claim 12 which further comprises a crosslinking agent.

14. The triazine polymer-containing composition of claim 13, wherein the crosslinking agent is a poly(meth)acrylic compound.

15. A process for forming a cured film or for forming a patterned film comprising curing or patterning a film formed from the triazine polymer-containing composition of claim 13.

16. A cured film obtained by curing the triazine polymer-containing composition of claim 12.

17. A pattern produced from the triazine polymer-containing composition of claim 13,
wherein the pattern is produced by the steps of:
irradiating the triazine polymer-containing composition light through a mask; and
developing the pattern with a developing solution.

18. An electronic device comprising a substrate and the cured film of claim 16 formed on the substrate.

19. An optical member comprising a substrate and the cured film of claim 16 formed on the substrate.

20. An electronic device comprising a substrate and the pattern of claim 17 formed on the substrate.

* * * * *